(12) United States Patent
Oyama

(10) Patent No.: US 11,337,349 B2
(45) Date of Patent: May 17, 2022

(54) COMPONENT FEEDING DEVICE

(71) Applicant: YAMAHA HATSUDOKI KABUSHIKI KAISHA, Iwata (JP)

(72) Inventor: Kazuyoshi Oyama, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 136 days.

(21) Appl. No.: 16/629,301

(22) PCT Filed: Aug. 1, 2017

(86) PCT No.: PCT/JP2017/027930
§ 371 (c)(1),
(2) Date: Jan. 7, 2020

(87) PCT Pub. No.: WO2019/026187
PCT Pub. Date: Feb. 7, 2019

(65) Prior Publication Data
US 2020/0205323 A1 Jun. 25, 2020

(51) Int. Cl.
*H05K 13/04* (2006.01)
*H05K 13/02* (2006.01)

(52) U.S. Cl.
CPC ......... *H05K 13/0419* (2018.08); *H05K 13/02* (2013.01)

(58) Field of Classification Search
CPC .................. H95K 13/02; H95K 13/0419
See application file for complete search history.

(56) References Cited

U.S. PATENT DOCUMENTS

| | | | |
|---|---|---|---|
| 6,402,452 B1 | 6/2002 | Miller et al. | |
| 7,472,737 B1* | 1/2009 | Rachkov | H05K 13/0417 29/739 |
| 7,930,819 B2* | 4/2011 | Yonemitsu | H05K 13/0417 29/739 |

(Continued)

FOREIGN PATENT DOCUMENTS

| | | |
|---|---|---|
| CN | 1550126 A | 11/2004 |
| CN | 101018476 A | 8/2007 |

(Continued)

OTHER PUBLICATIONS

International Search Report issued in PCT/JP2017/027930; dated Nov. 7, 2017.

*Primary Examiner* — Carl J Arbes
(74) *Attorney, Agent, or Firm* — Studebaker & Brackett PC

(57) ABSTRACT

A component feeding device includes a component exposing unit and a tape traveling guide unit. The component exposing unit lifts a cover tape of a component storage tape, and pushes a lifted part of the cover tape outward while folding the lifted part downward. The tape traveling guide unit guides the component storage tape to help it in traveling. The tape traveling guide unit includes a guide body and opening width defining members fitted to the guide body. The guide body has an opening serving as an opening for taking out a component, and a cover tape path demarcating portion that demarcates a path through a lifted part of the cover tape passes. Each of the opening width defining members defines the opening width of the opening, and applies a downward pressure to a first specific area of an upper surface of the carrier tape.

20 Claims, 27 Drawing Sheets

(56) References Cited

U.S. PATENT DOCUMENTS

| | | | |
|---|---|---|---|
| 9,674,995 B2* | 6/2017 | Yanagida | ............... H05K 13/02 |
| 10,542,648 B2* | 1/2020 | Matsumori | ........ H05K 13/0419 |
| 2003/0049109 A1 | 3/2003 | Yman | |

FOREIGN PATENT DOCUMENTS

| | | | |
|---|---|---|---|
| JP | 2011-155181 A | | 8/2011 |
| JP | 2011-204961 A | | 10/2011 |
| JP | 2015-053320 A | | 3/2015 |
| JP | 2016-197763 A | | 11/2016 |
| WO | 2013145039 A1 | | 10/2013 |
| WO | 2014097944 A1 | * | 6/2014 |

* cited by examiner

COMPONENT FEEDING DEVICE

CROSS-REFERENCE TO RELATED APPLICATION

This application is a National Stage of International Patent Application No. PCT/JP2017/027930, filed Aug. 1, 2017, the entire content of which is incorporated herein by reference.

BACKGROUND

Technical Field

The present disclosure relates to a component feeding device that feeds components stored in a component storage tape and to a component mounter having the component feeding device.

Background Art

A component mounter for mounting (packaging) electronic components (which will hereinafter be simply referred to as "components") on a board, such as a printed wiring board, is equipped with a component feeding device that supplies a component to a component take-out position. As the component feeding device, a device that uses a component storage tape storing components therein is known. The component storage tape is composed of a carrier tape having component storage portions in which components are stored, and a cover tape that is pasted on the carrier tape in such a way as to cover the component storage portions. The component feeding device of this type is disclosed, for example, in JP-A-2011-155181.

The component feeding device (feeder) disclosed in JP-A-2011-155181 includes a tape chute serving as a traveling path for a component storage tape, and a guide mechanism. This guide mechanism has a cutter that cuts the cover tape of the component storage tape that travels on the tape chute, a cover tape guide that guides the cut cover tape, an upper lid that covers the tape chute and the cover tape guide from above, and a storage portion in which a lifted part of the cover tape is placed. The tape chute is formed into a recessed shape along which the component storage tape travels downward and then travels upward.

According to the above component feeding device disclosed in JP-A-2011-155181, the cover tape of the component storage tape, which travels on the tape chute of the recessed shape, is cut by the cutter as a cut part of the cover tape is lifted by the cover tape guide. The lifted part of the cover tape lifted by the cover tape guide is pushed outward by the upper lid and is folded downward by the storage portion to stay in the storage portion. This exposes a component in the component storage portion of the component storage tape so that the component can be taken out.

The lifted part of the cover tape stays in the storage portion in a state of being pushed outward and folded downward relative to the carrier tape. As a result, a force of causing the cover tape to rise acts on the storage portion. When the storage portion applies an excessive force to the cover tape to prevent it from rising, it may impair the steadiness of traveling of the component storage tape and may also create a resistive force against traveling, which raises a possibility that the traveling performance of the component storage tape may deteriorate. The deterioration of the traveling performance of the component storage tape leads to a drop in the efficiency of supplying a component to an opening that serves as an opening for taking out a component stored in the component storage tape.

SUMMARY

The present disclosure has been conceived in view of the above circumstances, and it is therefore provides a component feeding device that can efficiently feed components stored in a component storage tape, and a component mounter having the component feeding device.

A component feeding device according to an aspect of the present disclosure is a component feeding device that sends off a component storage tape having a cover tape on an upper surface side of the component storage tape. The component storage tape includes a carrier tape having a plurality of component storage portions storing components therein. The component storage portions are arranged at given intervals, and the cover tape having both ends in a width direction joined to the carrier tape such that the cover tape covers the component storage portions, to feed the components. The component feeding device includes a pair of guide walls having guide surfaces that guide both lower surface ends of the component storage tape, respectively, the lower surface ends being both ends of a lower surface of the component storage tape in a tape width direction perpendicular to a tape send-off direction; a component exposing unit that carries out a component exposing process of lifting the cover tape of the component storage tape that travels as the lower surface ends of the component storage tape are guided by the guide surfaces, along a joined portion serving as a starting point, the joined portion being a portion where the cover tape is joined to the carrier tape, and pushing a lifted part of the cover tape to outside of a side edge in the tape width direction of the component storage tape while folding the lifted part downward to expose the component; and a tape traveling guide unit disposed on a downstream side in the tape send-off direction of the component exposing unit, the tape traveling guide unit guiding the component storage tape having been subjected to the component exposing process by the component exposing unit to help the component storage tape in traveling. The tape traveling guide unit includes a guide body having an opening facing the component storage portion, the opening having a given length in the tape send-off direction, and a cover tape path demarcating portion disposed outside the opening in the tape width direction, the cover tape path demarcating portion demarcating a cover tape path through which a lifted part of the cover tape passes; and an opening width defining member fitted to the guide body, the opening width defining member defining an opening width in the tape width direction of the opening and coming in contact with a first specific area of an upper surface of the carrier tape, the first specific area being between the component storage portion and the joined portion in the tape width direction, to apply a downward pressure to the first specific area.

A component mounter according to another aspect of the present disclosure includes the above component feeding device; and a head unit that takes out a component through the opening, the component being fed by the component feeding device.

Objects, features, and advantages of the present disclosure will be clarified through the following detailed description and the accompanying drawings.

DETAILED DESCRIPTION

A component feeding device and a component mounter according to embodiments of the present disclosure will now be described with reference to drawings. In the following description, the X-axis, the Y-axis, and the Z-axis in the rectangular coordinate system are used to explain directional relations. The X-axis direction is the direction parallel with a horizontal plane, the Y-axis direction is the direction perpendicular to the X-axis direction on a horizontal plane, and the Z-axis direction is the vertical direction perpendicular to both the X and Y directions. One side of the X-axis direction is referred to as "+X-side", and the other side of the same that is opposite to the one side is referred to as "−X-side". One side of the Y-axis direction is referred to as "+Y-side", and the other side of the same that is opposite to the one side is referred to as "−Y-side". One side, i.e., the upper side of the Z-axis direction is referred to as "+Z-side", and the other side, i.e., the lower side of the same that is opposite to the one side is referred to as "−Z-side".

[Configuration of Component Mounter]

Figure 1:
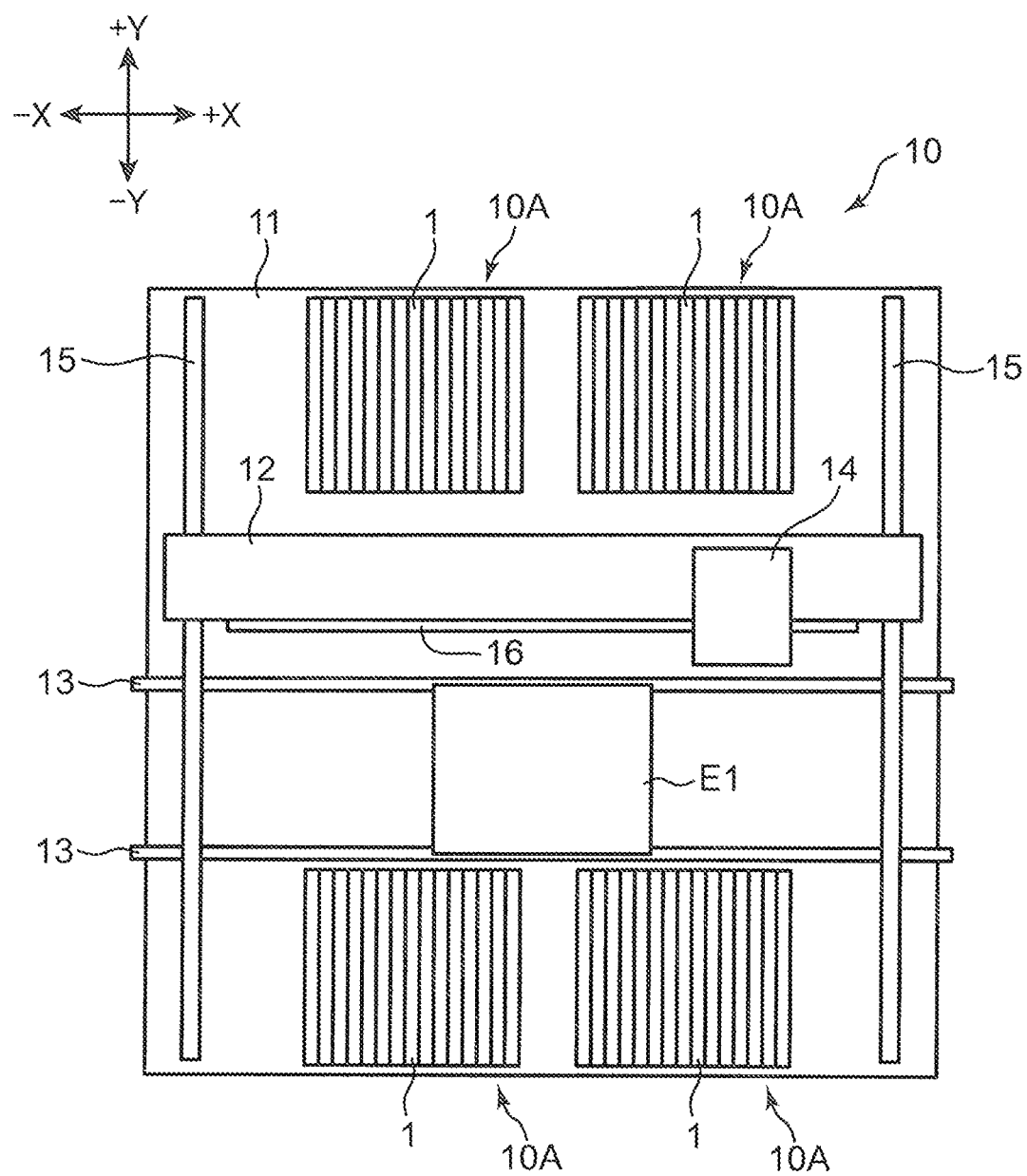
FIG. 1 is a top plan view of a component mounter according to one embodiment of the present disclosure.

FIG. 1 is a top plan view of a component mounter 10 according to one embodiment of the present disclosure. The component mounter 10 is an apparatus that mounts (packages) components on a board E1 to manufacture an electronic circuit board (component-carrying board). The component mounter 10 includes a component feeding section 10A, in which a plurality of component feeding devices 1 are arranged in the X-axis direction, a body frame 11, a mobile frame 12, conveyors 13, a head unit 14, first drive mechanisms 15, and a second drive mechanism 16.

The body frame 11 is a structure in which units making up the component mounter 10 are arranged. The body frame 11 is formed into a substantially rectangular shape in a plan view in the Z-axis direction. The conveyors 13 extend in the X-axis direction and are arranged in the body frame 11. The conveyors 13 transfer the board E1 in the X-axis direction. The board E1 on the conveyors 13 is transferred by the conveyors 13 to a given work location (component mounting location where a component is mounted on the board E1), where the board E1 is positioned.

The mobile frame 12 extends in the X-axis direction, and is supported by the body frame 11 such that the mobile frame 12 is allowed to move in a given direction (Y-axis direction). The mobile frame 12 carries the head unit 14. The head unit 14 is mounted on the mobile frame 12 such that the head unit 14 is allowed to move in the X-axis direction. In other words, the head unit 14 can be moved in the Y-axis direction as a result of movement of the mobile frame 12 in the Y-axis direction and can independently move in the X-axis direction along the mobile frame 12. The head unit 14 can move between the component feeding device 1 and the given work location to which the board E1 is transferred by the conveyors 13. The head unit 14 takes out a component, which is supplied to a component take-out position by the component feeding device 1, and mounts (packages) the taken out component on the board E1.

The head unit 14 has a suction nozzle, which is a holder capable of sucking and holding the component to be mounted on the board E1. The suction nozzle can communicate with any one of a negative pressure generator, a positive pressure generator, and the fresh air, via an electric selector valve. Specifically, supplying a negative pressure to the suction nozzle allows the nozzle to suck/hold the component (to take out the component). Afterward, supplying a positive pressure to the suction nozzle causes the nozzle to release the component. According to this embodiment, a holding piece different from the suction nozzle may be adopted. For example, a chuck that grips and holds a component may be used in place of the suction nozzle.

The first drive mechanisms 15 are disposed on a +X-side end and a −X-side end of the body frame 11, respectively. The first drive mechanisms 15 are mechanisms that move the mobile frame 12 in the Y-axis direction. Each the first drive mechanism 15 includes a drive motor, a ball screw shaft extending in the Y-axis direction and connected to the drive motor, and a ball nut disposed on the mobile frame 12 and screwed on the ball screw shaft. According to the first drive mechanism 15 configured in this manner, as a result of the rotation of the ball screw shaft caused by the drive motor, the ball nut moves back and forth along the ball screw shaft, which causes the mobile frame 12 to move in the Y-axis direction.

The second drive mechanism 16 is disposed on the mobile frame 12. The second drive mechanism 16 is a mechanism that moves the head unit 14 in the X-axis direction along the mobile frame 12. Similar to the first drive mechanism 15, the second drive mechanism 16 includes, for example, a drive motor, a ball screw shaft extending in the X-axis direction and connected to the drive motor, and a ball nut disposed on the head unit 14 and screwed on the ball screw shaft. According to the second drive mechanism 16 configured in this manner, as a result of the rotation of the ball screw shaft caused by the drive motor, the ball nut moves back and forth along the ball screw shaft, which causes the head unit 14 to move in the X-axis direction.

[Configuration of Component Feeding Device]

Figure 2:
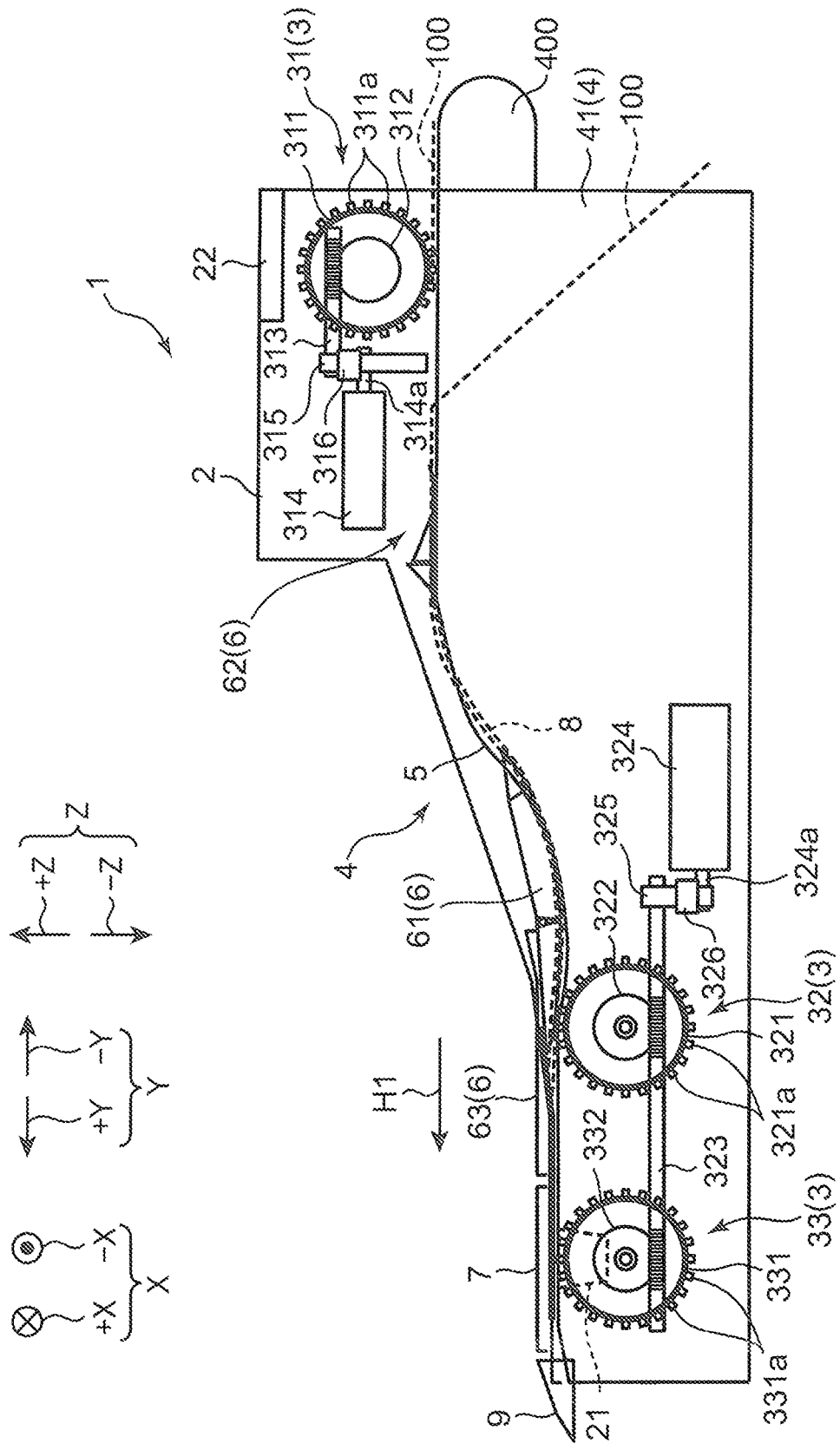
FIG. 2 is a side view of a component feeding device included in the component mounter.

FIG. 2 is a side view of a component feeding device 1 included in the component mounter 10. The component feeding device 1 is a device that executes a component feeding method of sending off a component storage tape 100, which stores components therein, in a tape send-off direction H1 to supply a component to a component take-out position 21. The component supplied to the component take-out position 21 by the component feeding device 1 is taken out from the component storage tape 100 by the head unit 14 included in the component mounter 10, and then is mounted on the board E1.

Figure 3A:
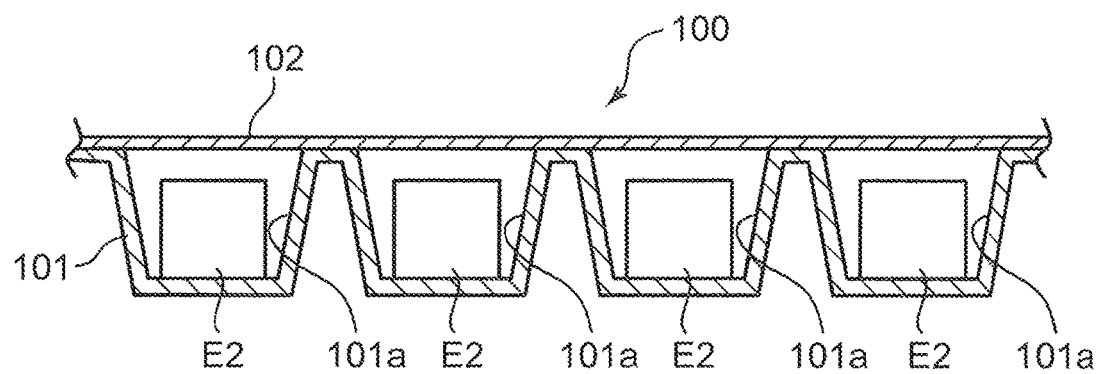
FIGS. 3A and 3B show configuration diagrams of the component storage tape used in the component feeding device.
Figure 3B:
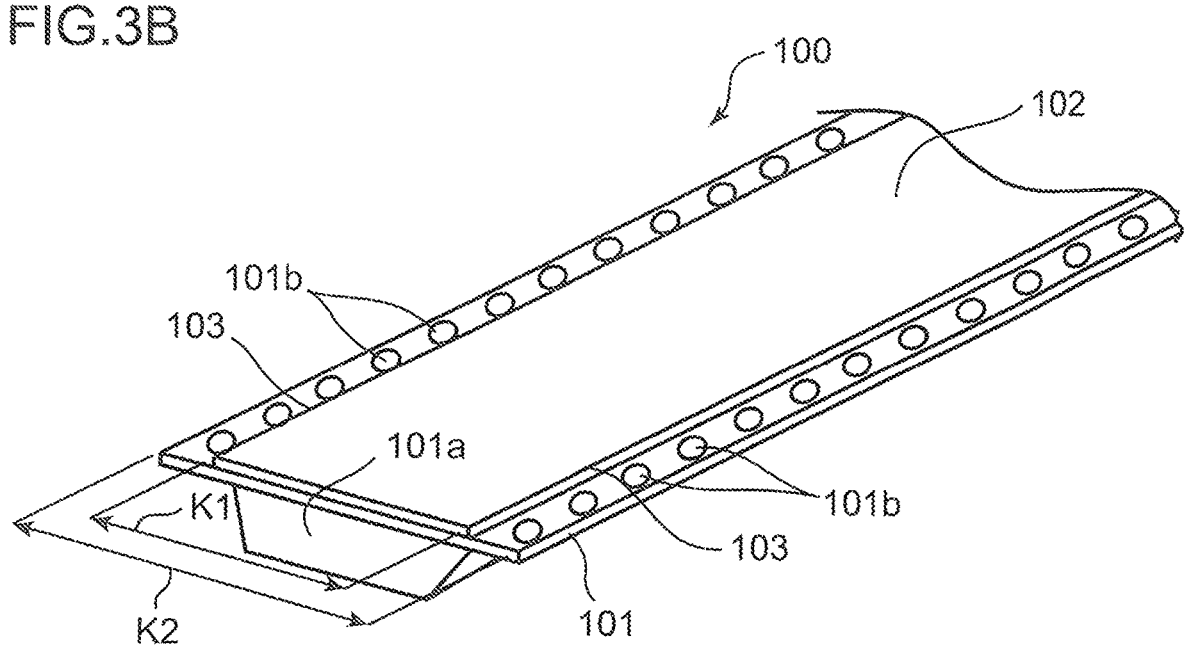

Before description of a configuration of the component feeding device 1, the component storage tape 100 will be described with reference to FIGS. 3A and 3B. FIGS. 3A and 3B show configuration diagrams of the component storage tape 100 used in the component feeding device 1. FIG. 3A is a sectional view showing a section of the component storage tape 100 cut along the tape send-off direction H1. FIG. 3B is a perspective view of the component storage tape 100.

The component storage tape 100 includes a carrier tape 101 and a cover tape 102, and is attached to the component feeding device 1. The carrier tape 101 is a tape having a plurality of component storage portions 101a storing components E2 therein, the component storage portions 101a being arranged at given intervals. The carrier tape 101 has holes 101b arranged at given intervals on its both ends in a width direction. These holes 101b are fitted to teeth of first sprockets 311, second sprockets 321, and third sprockets 331 of a tape send-off unit 3, which will be described later. "The holes 101b of the component storage tape 100 are fitted to the teeth of the first sprockets 311, the second sprockets 321, and the third sprockets 331" indicates a state in which the teeth are fitted in the holes 101b to allow sending off the component storage tape 100 in a motion interlocked with the rotation of the first sprockets 311, the second sprockets 321, and the third sprockets 331.

The cover tape 102 is a tape pasted on the carrier tape 101 in such a way as to cover the component storage portions 101a. The cover tape 102 is pasted on the carrier tape 101 by joining both ends in the width direction of the cover tape 102 to the carrier tape 101. As a result, on the component storage tape 100, joined portions 103, which result from the cover tape 102 being joined to the carrier tape 101, are formed respectively on both ends in the width direction of an upper surface of the carrier tape 101 such that the joined portions 103 extend linearly along edges in the width direction of the cover tape 102. In the width direction of the carrier tape 101, the joined portions 103 are located inward relative to the holes 101b.

According to the component storage tape 100 configured in the above manner, a length K1 between the joined portions 103 formed respectively on both ends in the width direction of the carrier tape 101 is substantially equal to a length in the width direction of the cover tape 102. A length K2 in the width direction (tape width) of the component storage tape 100 is equal to a length in the width direction of the carrier tape 101. The component storage tape 100 is a tape with a large width, having the tape width K2 of, for example, 32 mm or more.

Figure 4:
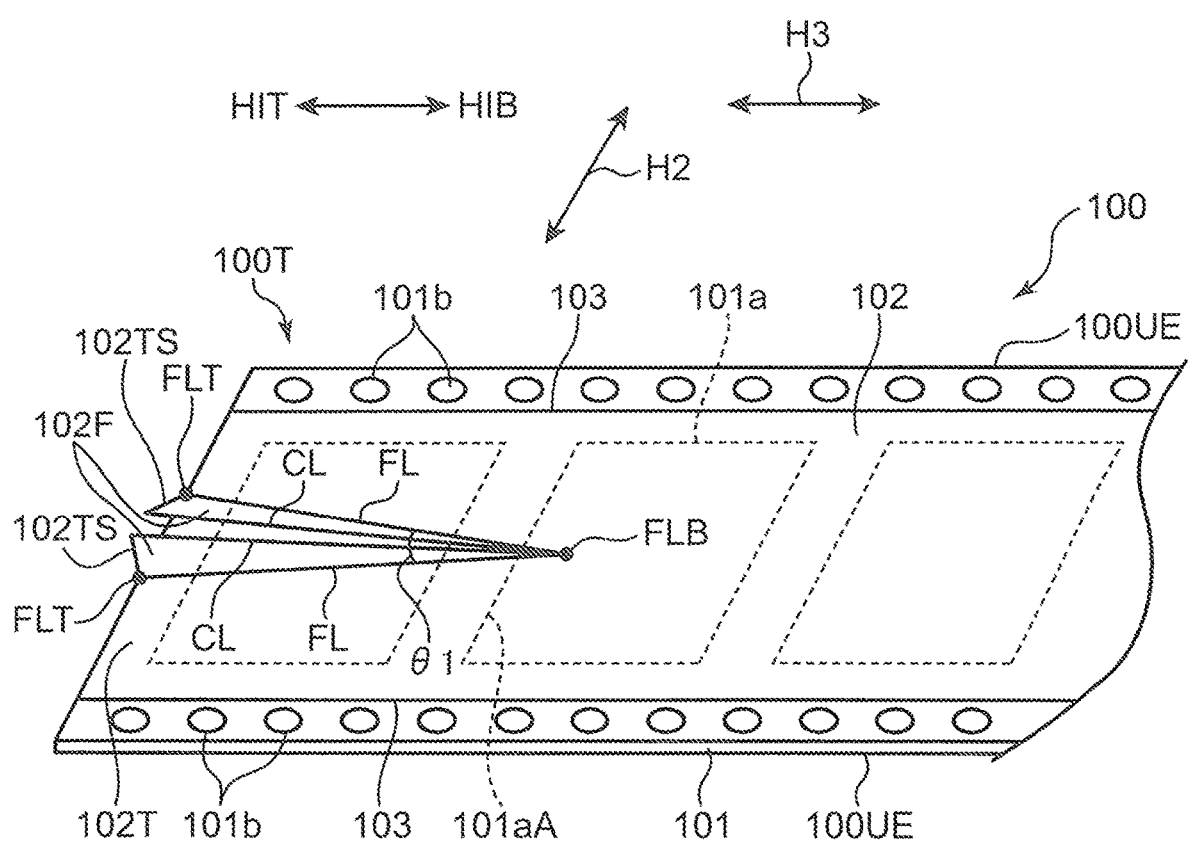
FIG. 4 is a perspective view showing a state of a tip end of the component storage tape.

According to this embodiment, before being attached to the component feeding device 1, the component storage tape 100 has its tip end 100T subjected to processing of a tip end of a tape, as shown in FIG. 4. The processing of a tip end of a tape will be summarized as follows. A tip end 102T of the cover tape 102 is cut along a longitudinal direction H3, from a given position (e.g., central position) between both ends in a tape width direction H2, the given position being on a tip edge 102TS of the cover tape 102. As a result, a pair of cut parts are formed on the tip end 102T of the cover tape 102, the cut parts being divided parts formed on both sides in the tape width direction H2 across a cut line CL. Subsequently, the pair of cut parts are lifted such that respective tip edges 102TS of the cover tape 102 on the pair of cut parts are separated upward from the carrier tape 101. A pair of lifted parts are thus formed. The pair of lifted parts are then each folded along a fold FL. This creates a pair of triangular fold pieces 102F each formed of the tip edge 102TS, the cut line CL, and the fold FL serving as three sides.

By the above processing of a tip end of a tape, the pair of right-triangular fold pieces 102F each having the fold FL serving as an oblique side are formed on the tip end 102T of the cover tape 102 as a result of lifting the cover tape 102 off the carrier tape 101 and folding lifted parts of the cover tape 102. On the tip end 102T of the cover tape 102, end points FLB on the rear end side H1B of respective folds FL of the pair of fold pieces 102F coincide to form a single end point FLB located at a midpoint in the tape width direction H2. In contrast, end points FLT on the tip end side H1T of respective folds FL of the pair of fold pieces 102F are separated from each other in the tape width direction H2 and are located slightly offset to the midpoint to be closer to both ends in the tape width direction H2. The folds FL of the pair of fold pieces 102F extend linearly from the end points FLT on the tip end side H1T to the end point FLB on the rear end side H1B in such a way as to be inwardly diagonal in the tape width direction H2 relative to a longitudinal direction H3. An angle θ1 made by respective folds FL of the pair of fold pieces 102F is an acute angle.

As shown in FIG. 2, the component feeding device 1 includes a device body 2, the tape send-off unit 3, a tape traveling path forming unit 4, a component exposing unit 6, a tape traveling guide unit 7, a lid member 8, and a tape ejection guide unit 9. The device body 2 is an enclosure in which units making up the component feeding device 1 are housed. To the device body 2, an operation unit 22 is annexed. The operation unit 22 is a unit to which an instruction to cause the component feeding device 1 to operate is input by an operator.

Figure 5:
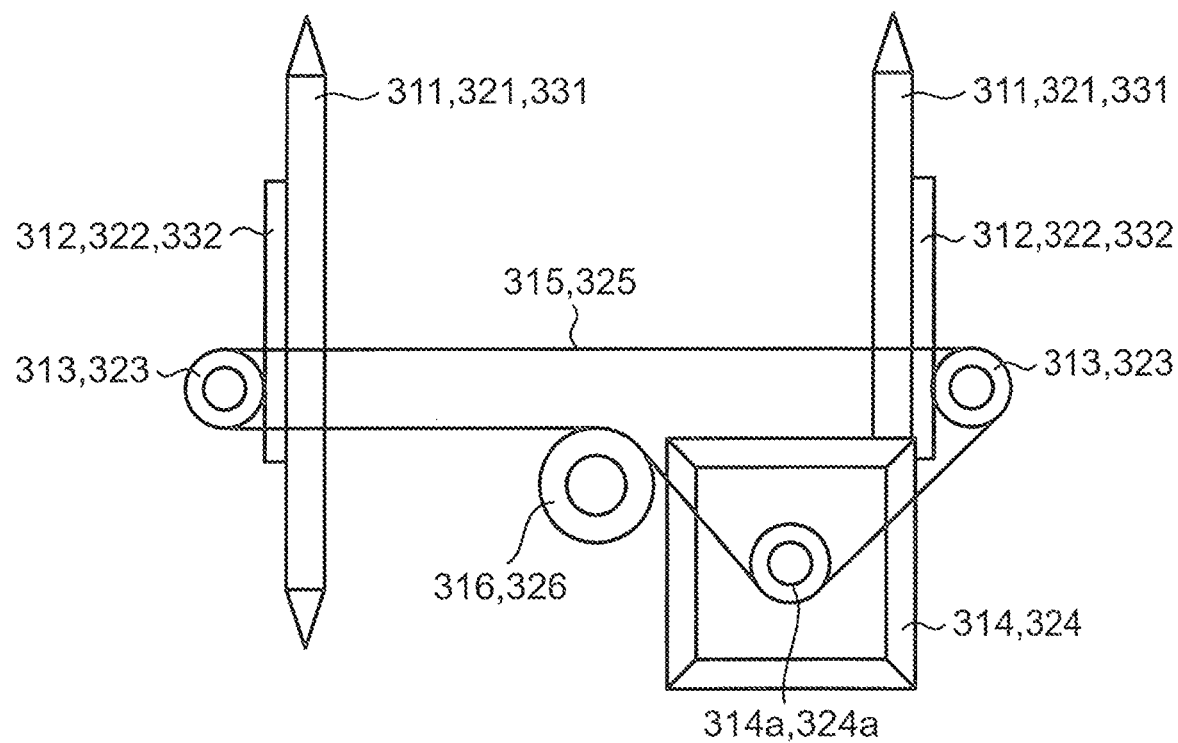
FIG. 5 is a view of a tape send-off unit seen in a tape send-off direction, the tape send-off unit being included in the component feeding device.
Figure 6:
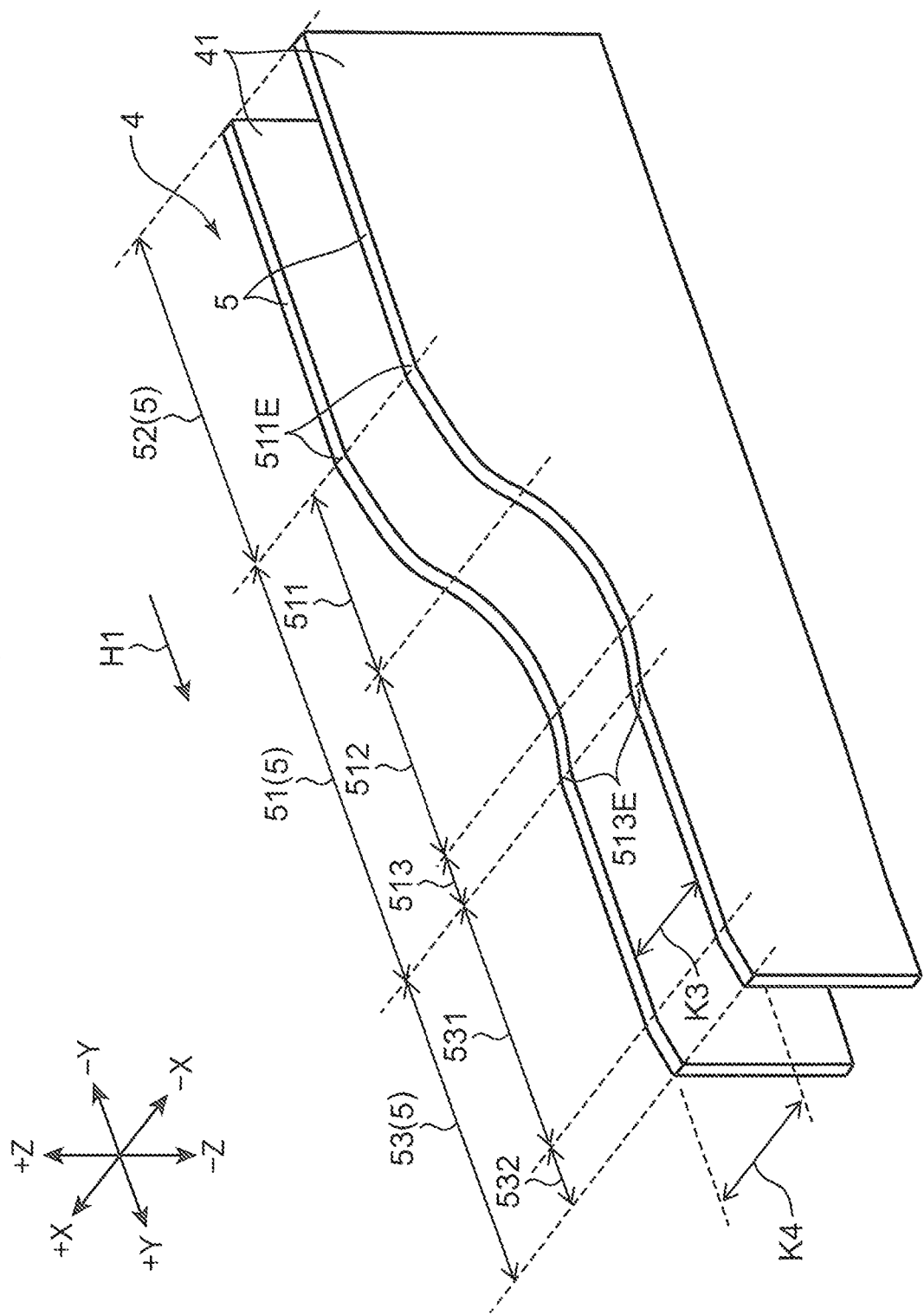
FIG. 6 is a perspective view of a configuration of a tape traveling path forming unit included in the component feeding device.

FIG. 5 is a schematic diagram of a configuration of the tape send-off unit 3 included in the component feeding device 1, showing a view of the tape send-off unit 3 seen in the tape send-off direction H1. FIG. 6 is a perspective view of a configuration of the tape traveling path forming unit 4 included in the component feeding device 1.

The tape send-off unit 3 executes a tape send-off step of a component feeding process to send off the component storage tape 100, which has the cover tape 102 located on its upper surface side, in the given tape send-off direction H1 along the direction of arrangement of the component storage portions 101*a*, toward the component take-out position 21. The tape send-off direction H1, in which the component storage tape 100 is sent off by the tape send-off unit 3 toward the component take-out position 21, is the direction of heading from the −Y-side to the +Y-side. The tape send-off unit 3 intermittently sends off the component storage tape 100 in the tape send-off direction H1 so that the component storage portions 101*a* reach the component take-out position 21 one by one at given time intervals. The tape send-off unit 3 is configured to be capable of executing a loading operation of sending off the component storage tape 100 in the tape send-off direction H1 toward the component take-out position 21 and an unloading operation of sending off the component storage tape 100 in a direction of heading from the +Y-side to the −Y-side, which is opposite to the tape send-off direction H1.

The tape traveling path forming unit 4 forms a traveling path through which the component storage tape 100 sent off by the tape send-off unit 3 travels to reach the component take-out position 21. As shown in FIGS. 2 and 6, the tape traveling path forming unit 4 includes a pair of guide walls 41.

The pair of guide walls 41 are a pair of walls arranged counter to each other across a given gap in the X-axis direction and extending in the Y-axis direction in the device body 2. The component storage tape 100 sent off by the tape send-off unit 3 has lower surface ends 100UE (see FIG. 4), which are both ends in a tape width direction H2 (X-axis direction) of a lower surface of the component storage tape 100. These lower surface ends 100UE are guided respectively by guide surfaces 5, which are upper end faces of the pair of guide walls 41. In other words, the traveling path for the component storage tape 100 is formed along the guide surfaces 5 of the pair of guide walls 41. From the pair of guide walls 41, areas are cut out, the areas being occupied by a pair of second sprockets 321 of a second tape send-off portion 32 of the tape send-off unit 3 and a pair of third sprockets 331 of a third tape send-off portion 33 of the same. These second and third sprockets 321 and 331 will be described later.

A distance K3 between respective inner surfaces of the pair of guide walls 41, the inner surfaces being counter to each other, is determined to be substantially equal with the length K1 between joined portions 103 of the component storage tape 100. A distance K4 between respective outer surfaces of the pair of guide walls 41 is determined to be substantially equal with the tape width K2 of the component storage tape 100.

Each of the guide surfaces 5 of the pair of guide walls 41, the guide surfaces 5 guiding the lower surface ends 100UE of the component storage tape 100, includes a first guide surface portion 51, a second guide surface portion 52, and a third guide surface portion 53, as shown in FIG. 6. The first guide surface portion 51 of the guide surface 5 makes up a sloped portion of a curved shape. The first guide surface portion 51 is formed into a curved shape in which a lowermost downstream end in the tape send-off direction H1 is located on the lower side (−Z-side) relative to an uppermost upstream end. The first guide surface portion 51 has a first curved area 511 on the uppermost upstream side in the tape send-off direction H1, a second curved area 512 continuous with the downstream side in the tape send-off direction H1 of the first curved area 511, and a third curved area 513 continuous with the downstream side in the tape send-off direction H1 of the second curved area 512.

The first curved area 511 of the first guide surface portion 51 is formed into an upward curved shape in a view in the X-axis direction. The second curved area 512 of the first guide surface portion 51 is formed into a downward curved shape in a view in the X-axis direction. The third curved area 513 of the first guide surface portion 51 is formed into an upward curved shape in a view in the X-axis direction. In this third curved area 513, a lowermost downstream end 513E in the tape send-off direction H1 is located on the lower side (−Z-side) relative to an uppermost upstream end 511E in the tape send-off direction H1 of the first curved area 511 and is at the same height in the vertical direction (Z-axis direction) as the height of the component take-out position 21.

The second guide surface portion 52 of the guide surface 5 is continuous with the upstream side in the tape send-off direction H1 of the first guide surface portion 51. According to this embodiment, the second guide surface portion 52 is formed in such a way as to extend horizontally from the upstream side to the downstream side in the tape send-off direction H1.

The third guide surface portion 53 of the guide surface 5 is continuous with the downstream side in the tape send-off direction H1 of the first guide surface portion 51, and extends to reach the component take-out position 21. According to this embodiment, the third guide surface portion 53 has a horizontal area 531 and a sloped area 532. The horizontal area 531 is an area that is continuous with the lowermost downstream end 513E of the third curved area 513 of the first guide surface portion 51 and that extends horizontally along the tape send-off direction H1. A downstream end in the tape send-off direction H1 of the horizontal area 531 of the third guide surface portion 53 matches the component take-out position 21 in the tape send-off direction H1. In this manner, the component take-out position 21 is located in the horizontal area 531, which is the horizontal area of the third guide surface portion 53. This configuration improves the accuracy of a process of taking out a component E2 from the component storage tape 100 at the component take-out position 21. The sloped area 532 is an area that is continuous with the downstream side in the tape send-off direction H1 of the horizontal area 531 and that slopes downward in the forward direction.

A configuration of the tape send-off unit 3 will be described specifically with reference to FIGS. 2 and 5. The tape send-off unit 3 includes a first tape send-off portion 31, a second tape send-off portion 32, and a third tape send-off portion 33.

The first tape send-off portion 31 is disposed on upstream ends in the tape send-off direction H1 of the second guide surface portions 52 of the guide surfaces 5. The first tape send-off portion 31 sends off the component storage tape 100 with its tip end provided as a free end, thereby causing the component storage tape 100 to travel on the second guide surface portions 52 and the first guide surface portions 51. The first tape send-off portion 31 includes the pair of first sprockets 311, a pair of first worm wheel 312, a pair of first worms 313, a first servomotor 314, a first belt 315, and a first tension roller 316.

The pair of first sprockets 311 are disc-shaped sprockets that are supported on the device body 2 in such a way as to be capable of rotating respectively around an axis extending in the X-axis direction (tape width direction H2). The pair of first sprockets 311 have a plurality of teeth 311a arranged circumferentially at given intervals. Respective sets of teeth 311a of the pair of first sprockets 311 can be fitted in respective groups of holes 101b formed on both ends in the tape width direction H2 of the carrier tape 101 of the component storage tape 100. The pair of first sprockets 311 each have a built-in one-way clutch that transmits a torque in one direction only.

The pair of first worm wheels 312 are worm gears that are arranged coaxial respectively with the pair of first sprockets 311. The pair of first worms 313 are screw gears that engage respectively with the pair of first worm wheels 312.

The first servomotor 314 is a driving source that generates a driving force that causes the pair of first sprockets 311 to rotate. The first servomotor 314 has a motor output shaft 314a that outputs the driving force. The first belt 315 is an endless belt which is stretched with a tension between the motor output shaft 314a and the pair of first worms 313. The first belt 315 runs through a looped path as a result of the rotation of the first servomotor 314. The first tension roller 316 is a roller that is in contact with the peripheral surface of the first belt 315 to give a tension to the first belt 315.

According to the first tape send-off portion 31 configured in the above manner, the rotation driving force of the first servomotor 314 is transmitted to the pair of first worm wheels 312 via the first belt 315 and the pair of first worms 313, thus causing the pair of first worm wheels 312 to rotate. When the pair of first worm wheels 312 rotate, their rotation causes the pair of first sprockets 311 to rotate in an interlocked motion. As the pair of first sprockets 311 rotate, the first sprockets 311 send off the component storage tape 100 including the carrier tape 101 having the holes 101b in which the teeth 311a of the first sprockets 311 are fitted.

The second tape send-off portion 32 is disposed on the downstream side in the tape send-off direction H1 of the first tape send-off portion 31. The second tape send-off portion 32 is disposed on downstream ends in the tape send-off direction H1 of the first guide surface portions 51 of the guide surfaces 5, that is, disposed on upstream ends in the tape send-off direction H1 of the third guide surface portions 53. The second tape send-off portion 32 receives the component storage tape 100, which is sent off by the first tape send-off portion 31 to travel on the first guide surface portions 51, and sends off the component storage tape 100 toward the component take-out position 21. The second tape send-off portion 32 thus causes the component storage tape 100 to travel on the third guide surface portions 53.

Similar to the first tape send-off portion 31, the second tape send-off portion 32 includes the pair of second sprockets 321, a pair of second worm wheel 322, a pair of second worms 323, a second servomotor 324, a second belt 325, and a second tension roller 326.

The pair of second sprockets 321 are disc-shaped sprockets that are supported on the device body 2 in such a way as to be capable of rotating respectively around an axis extending in the X-axis direction (tape width direction H2). The pair of second sprockets 321 have a plurality of teeth 321a arranged circumferentially at given intervals. On the pair of second sprockets 321, teeth 321a located on the +Z-side in the Z-axis direction are exposed from the guide surfaces 5 of the pair of guide walls 41. Respective sets of teeth 321a of the pair of second sprockets 321 can be fitted in respective groups of holes 101b formed on both ends in the tape width direction H2 of the carrier tape 101 of the component storage tape 100.

The pair of second worm wheels 322 are worm gears that are arranged coaxial respectively with the pair of second sprockets 321. The pair of second worms 323 are screw gears that engage respectively with the pair of second worm wheels 322.

The second servomotor 324 is a driving source that generates a driving force that causes the pair of second sprockets 321 to rotate. The second servomotor 324 has a motor output shaft 324a that outputs the driving force. The second belt 325 is an endless belt which is stretched with a tension between the motor output shaft 324a and the pair of second worms 323. The second belt 325 runs through a looped path as a result of the rotation of the second servomotor 324. The second tension roller 326 is a roller that is in contact with the peripheral surface of the second belt 325 to give a tension to the second belt 325.

According to the second tape send-off portion 32 configured in the above manner, the rotation driving force of the second servomotor 324 is transmitted to the pair of second worm wheels 322 via the second belt 325 and the pair of second worms 323, thus causing the pair of second worm wheels 322 to rotate. When the pair of second worm wheels 322 rotate, their rotation causes the pair of second sprockets 321 to rotate in an interlocked motion. As the pair of second sprockets 321 rotate, the second sprockets 321 send off the component storage tape 100 including the carrier tape 101 having the holes 101b in which the teeth 321a of the second sprockets 321 are fitted.

When the tip end 100T of the component storage tape 100 sent off by the first tape send-off portion 31 reaches the pair of second sprockets 321 and, at the tip end 100T of the component storage tape 100, the holes 101b of the carrier tape 101 are fitted to the teeth 321a of the pair of second sprockets 321, the first servomotor 314 comes to a stop. When the first servomotor 314 stops in this manner, a rotating shaft of the first sprockets 311 stops. However, the one-way clutch interposed between the rotating shaft and each of the first sprockets 311 allows the first sprockets 311 to rotate in a motion interlocked with the travel of the component storage tape 100, which is sent off by the rotation of the pair of second sprockets 321, even when the rotating shaft does not rotate.

The third tape send-off portion 33 is disposed on downstream ends in the tape send-off direction H1 of the horizontal areas 531 of the third guide surface portions 53 of the guide surfaces 5. In other words, the third tape send-off portion 33 is disposed close to the component take-out position 21 on the downstream side in the tape send-off direction H1 of the second tape send-off portion 32. The third tape send-off portion 33 sends off the component storage tape 100 as the third tape send-off portion 33 makes an interlocked motion with the second tape send-off portion 32. The third tape send-off portion 33 receives the component storage tape 100, which is sent off by the second tape send-off portion 32 to travel on the third guide surface portions 53, and sends off the component storage tape 100 to cause it to pass the component take-out position 21. In the above configuration in which the third tape send-off portion 33 is disposed close to the component take-out position 21 and receives the component storage tape 100 in such a location, the component storage tape 100 can be sent off in a state in which the component storage tape 100 is positioned highly accurately relative to the component take-out position 21.

The third tape send-off portion 33 includes the pair of third sprockets 331, and a pair of third worm wheels 332. The above expression "the third tape send-off portion 33 is disposed close to the component take-out position 21" means that, in a view in the X-axis direction, the third tape send-off portion 33 is disposed such that the component take-out position 21 is in an area occupied by the pair of third sprockets 331 in the tape send-off direction H1. In a view in the X-axis direction, the component take-out position 21 may be directly above the top (uppermost end) of the pair of third sprockets 331 or may be at a position shifted in the Y-axis direction from the position directly above the top of the pair of third sprockets 331. When the component take-out position 21 is determined to be a position shifted in the Y-axis direction from the position directly above the top of the pair of third sprockets 331, it is preferable that the component take-out position 21 be shifted not toward the downstream side but toward the upstream side in the tape send-off direction H1. The reason for preferring this arrangement is that, at the position shifted toward the upstream side, an area of component storage tape 100 that passes the component take-out position 21, the component storage tape 100 being sent off by the pair of third sprockets 331 of the third tape send-off portion 33, is in a state of being pulled and therefore hardly deforms, in which case the component storage tape 100 is positioned highly accurately relative to the component take-out position 21.

The pair of third sprockets 331 are disc-shaped sprockets that are supported on the device body 2 in such a way as to be capable of rotating respectively around an axis extending in the X-axis direction (tape width direction H2). The pair of third sprockets 331 have a plurality of teeth 331a arranged circumferentially at given intervals. On the pair of third sprockets 331, teeth 331a located on the +Z-side are exposed from the guide surfaces 5 of the pair of guide walls 41. Respective sets of teeth 331a of the pair of third sprockets 331 can be fitted in respective groups of holes 101b formed on both ends in the tape width direction H2 of the carrier tape 101 of the component storage tape 100.

The pair of third worm wheels 332 are worm gears that are arranged coaxial respectively with the pair of third sprockets 331. The pair of third worm wheels 332 engage respectively with the pair of second worms 323.

According to the third tape send-off portion 33 configured in the above manner, which operates in the same manner as the second tape send-off portion 32 does, the rotation driving force of the second servomotor 324 is transmitted to the pair of third worm wheels 332 via the second belt 325 and the pair of second worms 323, thus causing the pair of third worm wheels 332 to rotate. When the pair of third worm wheels 332 rotate, their rotation causes the pair of third sprockets 331 to rotate in an interlocked motion. As the pair of third sprockets 331 rotate, the third sprockets 331 send off the component storage tape 100 including the carrier tape 101 having the holes 101b in which the teeth 331a of the third sprockets 331 are fitted.

The component feeding device 1 can be equipped with a plurality of reels (not depicted) around which component storage tapes 100 are wound respectively. A component feeding operation by the component feeding device 1 will be described with reference to FIG. 2, as follows. An operator, as preparation work, first attaches a reel around which a component storage tape 100 preceding in component feeding by the component feeding device 1 (preceding component storage tape) is wound, to the component feeding device 1. The operator then fits a tip end of the preceding component storage tape 100 to the first sprockets 311. Subsequently, the operator operates the operation unit 22 to enter an instruction to rotate the first sprockets 311. As a result, the preceding component storage tape 100 is sent off and its tip end is fitted to the second sprockets 321.

At a point at which the above preparation work is over, the component feeding device 1 starts its component feeding operation. In the component feeding device 1, the second sprockets 321 rotate, thus sending off the preceding component storage tape 100. At this time, the first sprockets 311 are left idling. The rotating second sprockets 321 thus send off the preceding component storage tape 100.

In a state in which the preceding component storage tape 100 is sent off by the second sprockets 321, the operator operates a tape switching device 400, which is disposed on the uppermost upstream side of the guide surfaces 5, to cause a part of preceding component storage tape 100 that is on the upstream side to shift its position downward (toward the −Z-side). As a result, the preceding component storage tape 100 is disengaged from the first sprockets 311. At this point of time, the preceding component storage tape 100 is already fitted to the second sprockets 321. When disengaged from the first sprockets 311, therefore, the preceding component storage tape 100 is kept sent off by the second sprockets 321.

In a state in which the preceding component storage tape 100 is sent off by the second sprockets 321, the operator attaches a reel around which a component storage tape 100 that follows the preceding component storage tape 100, i.e., following component storage tape 100 is wound, to the component feeding device 1. The operator then fits a tip end of the following component storage tape 100 to the first sprockets 311. In this manner, before components in the preceding component storage tape 100 are all taken out, the reel around which the following component storage tape 100 is wound can be attached to the component feeding device 1. Subsequently, at a point of time at which the preceding component storage tape 100 is completely reeled out, sending off the following component storage tape 100 is automatically started.

Figure 7:
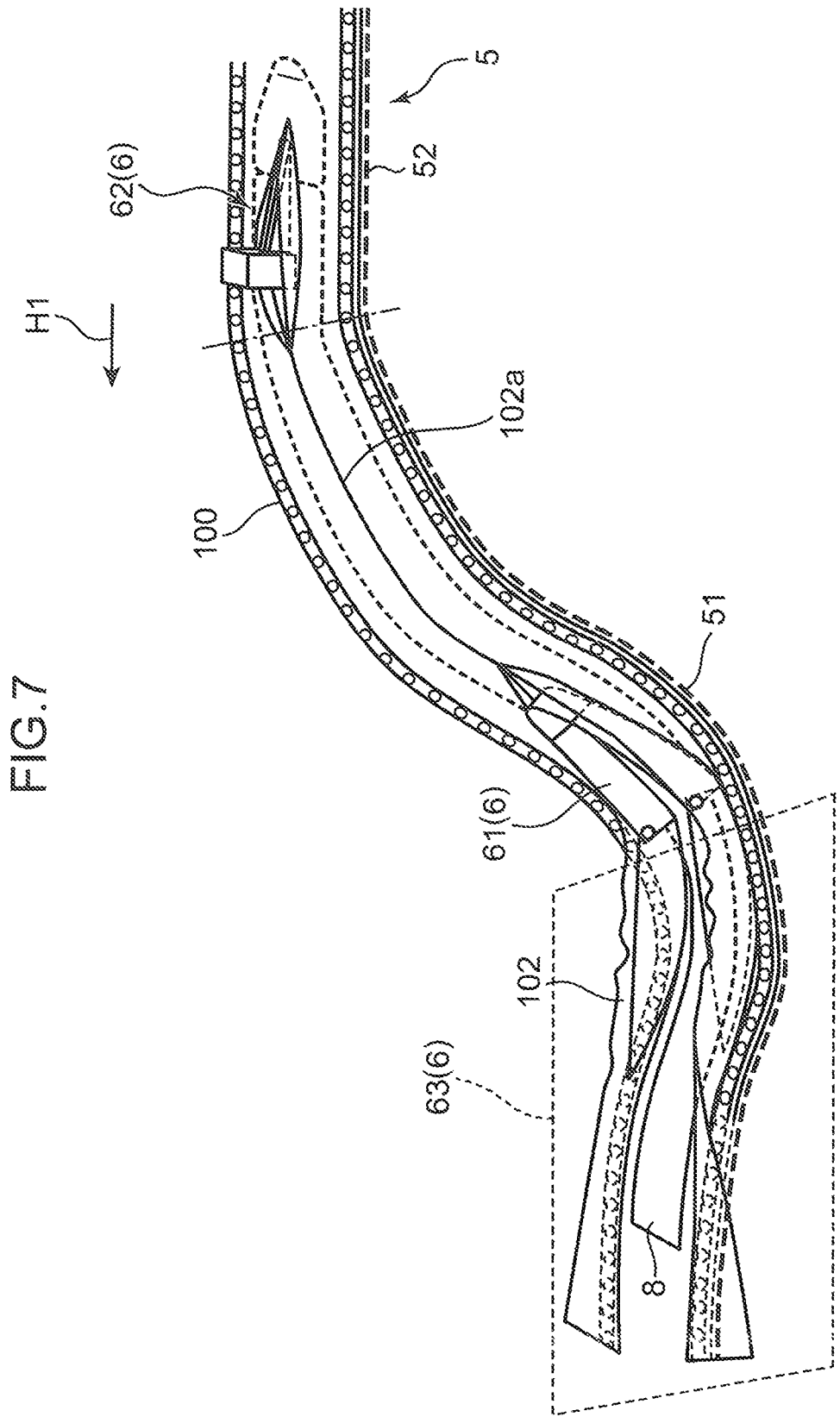
FIG. 7 is a perspective view of a configuration of a component exposing unit included in the component feeding device.

FIG. 7 is a perspective view of a configuration of the component exposing unit 6 included in the component feeding device 1. The component exposing unit 6 carries out a component exposing process of lifting the cover tape 102 of the component storage tape 100, which is sent off as its both lower surface ends 100UE are guided by the guide surfaces 5 of the pair of guide walls 41, along the joined portions 103 serving as starting points, where the cover tape 102 is joined to the carrier tape 101, and pushing lifted parts of the cover tape 102 to outside of the side edges in the tape width direction H2 of the component storage tape 100 while folding the lifted parts downward (toward the −Z-side) to expose the component E2 in the component storage portion 101a. The component exposing unit 6 includes a cover tape lifting portion 61, a cover tape pre-processing portion 62, and a cover tape post-processing portion 63.

The cover tape lifting portion 61 is disposed between the pair of guide walls 41 such that the cover tape lifting portion 61 corresponds to the first guide surface portions 51 of the guide surfaces 5. The cover tape lifting portion 61 carries out a lifting process of lifting the cover tape 102 off the carrier tape 101 such that an extent of lifting the cover tape 102 off the carrier tape 101 increases continuously on the component storage tape 100, which travels as its lower surface ends 100UE are guided by the first guide surface portions 51 of the guide surfaces 5 of the pair of guide walls 41. The cover tape lifting portion 61 carries out the lifting process of lifting the cover tape 102, thereby executing a lifting step included in the component feeding process.

The cover tape pre-processing portion 62 is disposed between the pair of guide walls 41 such that the cover tape pre-processing portion 62 corresponds to the second guide surface portions 52 of the guide surfaces 5. Before the cover tape lifting portion 61 carries out the lifting process, the cover tape pre-processing portion 62 carries out pre-processing of cutting the cover tape 102. The cover tape pre-processing portion 62 carries out the pre-processing on the cover tape 102, thereby executing a pre-processing step included in the component feeding process.

The cover tape post-processing portion 63 is disposed on the upper side (+Z-side) relative to the cover tape lifting portion 61 such that the cover tape post-processing portion 63 corresponds to the first guide surface portions 51 of the guide surfaces 5. The cover tape post-processing portion 63 carries out post-processing of pushing lifted parts of the cover tape 102 lifted by the cover tape lifting portion 61 to outside of respective side edges in the tape width direction H2 of the component storage tape 100 while folding the lifted parts downward (toward the −Z-side) to make the component storage portion 101a open to the outside. The cover tape post-processing portion 63 carries out the post-processing on the cover tape 102, thereby executing a post-processing step included in the component feeding process.

Figure 8:
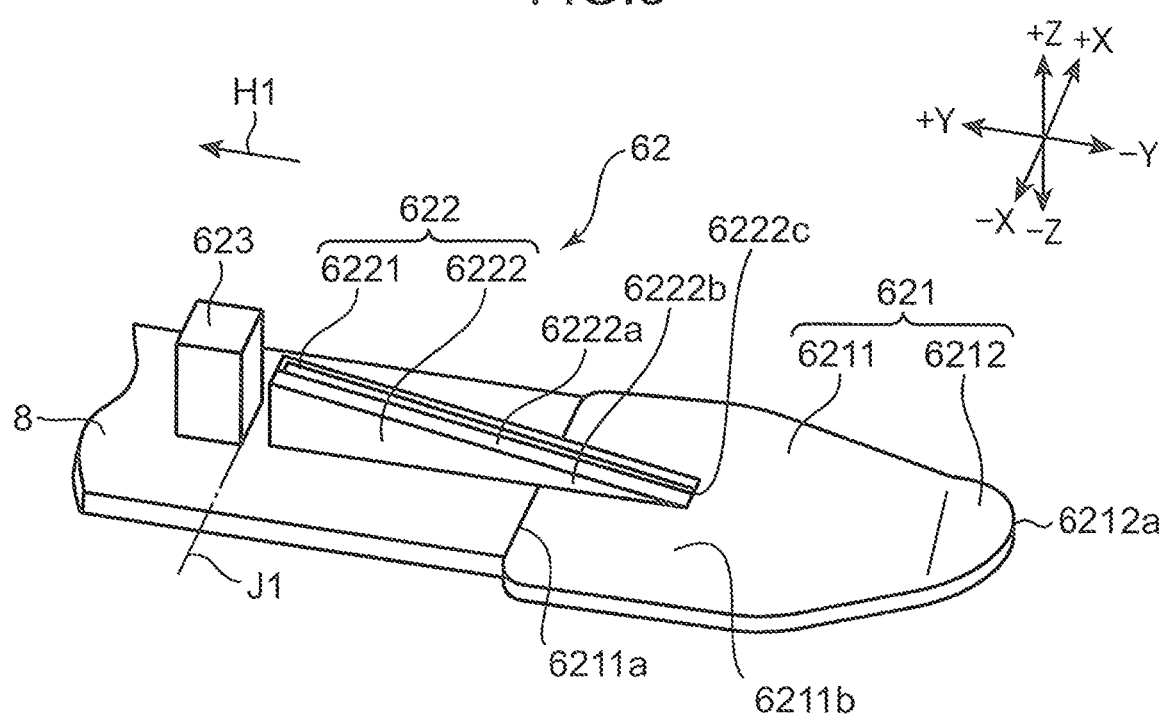
FIG. 8 is a perspective view of a configuration of a cover tape pre-processing portion of the component exposing unit.
Figure 9:
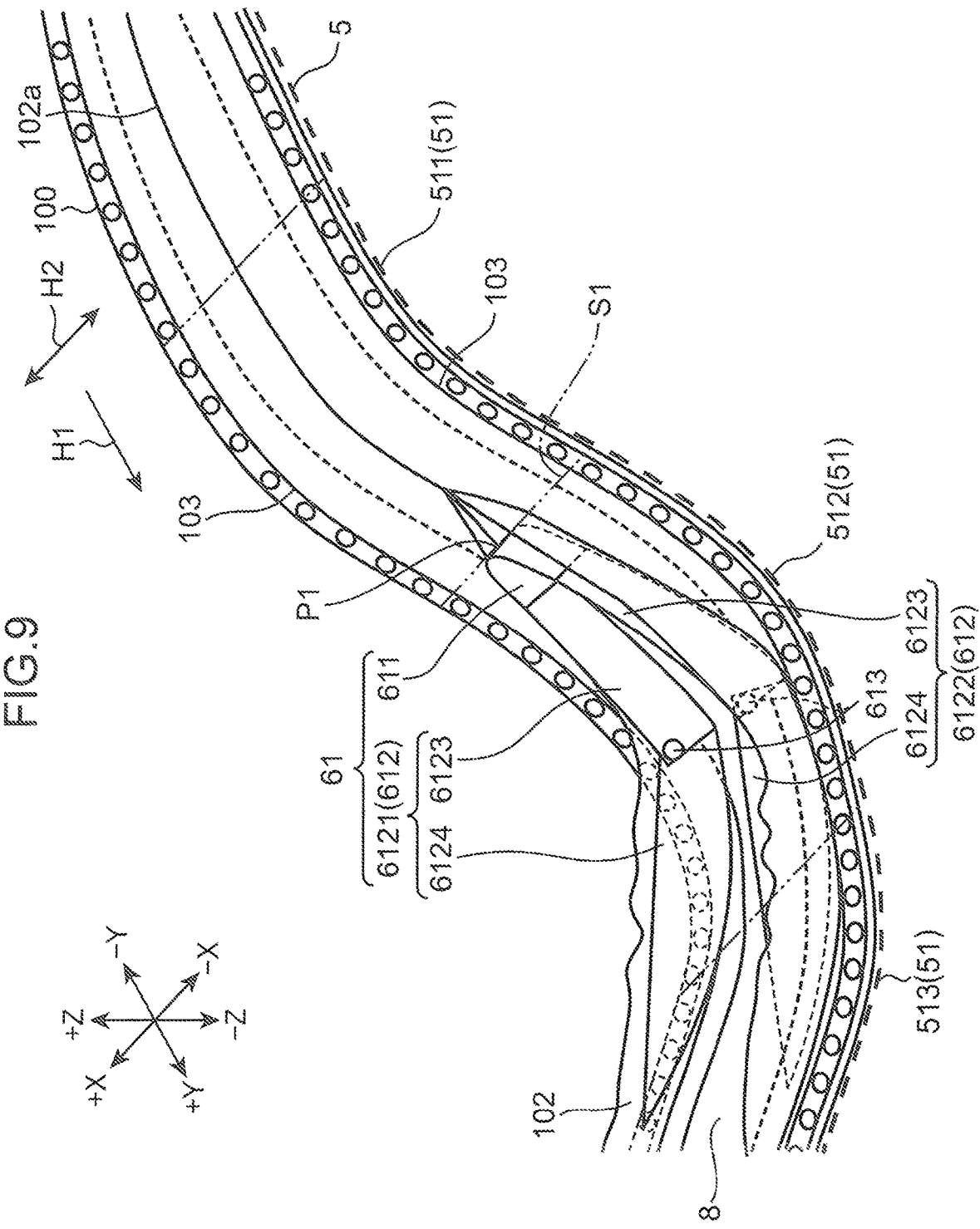
FIG. 9 is a perspective view of a configuration of a cover tape lifting portion of the component exposing unit.
Figure 10:
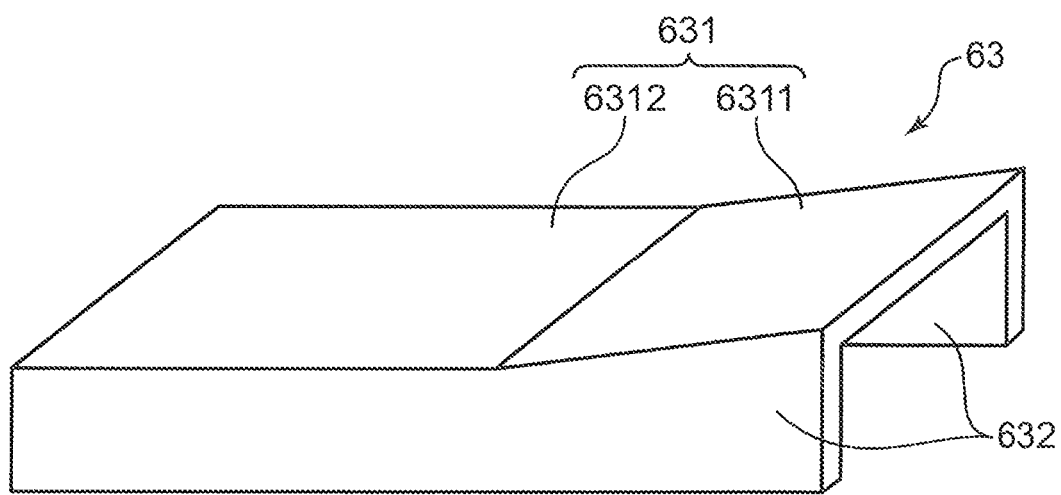
FIG. 10 is a perspective view of a configuration of a cover tape post-processing portion of the component exposing unit.
Figure 11:
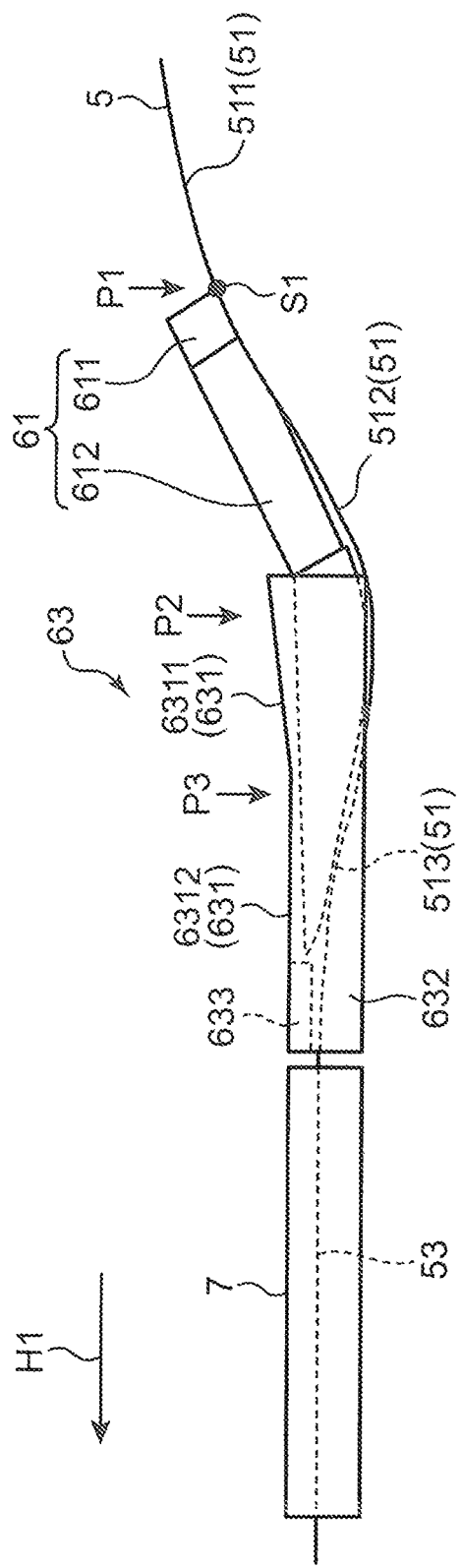
FIG. 11 is a side view of the cover tape post-processing portion.
Figure 12:
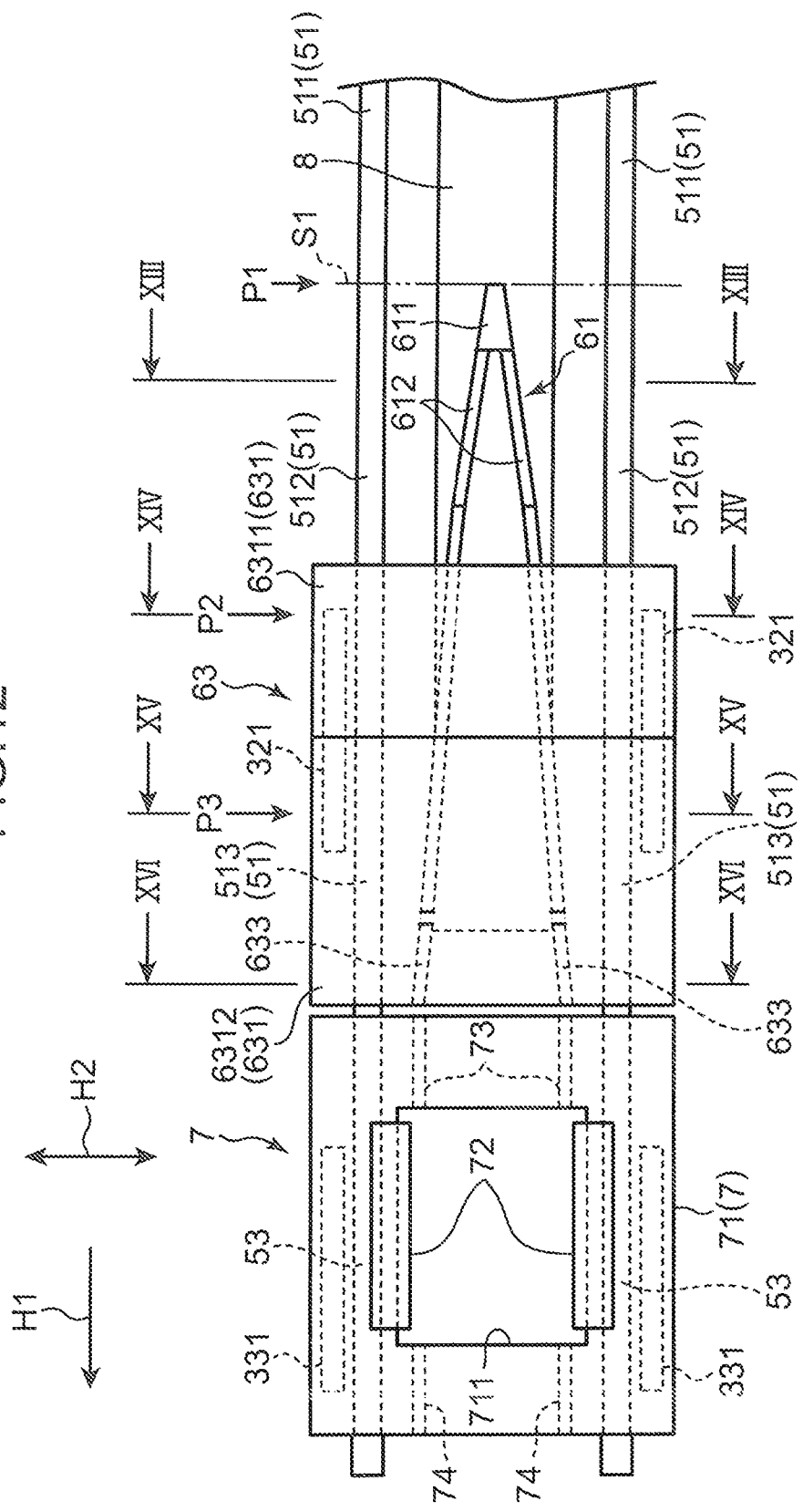
FIG. 12 is a top plan view of the cover tape post-processing portion.
Figure 13:
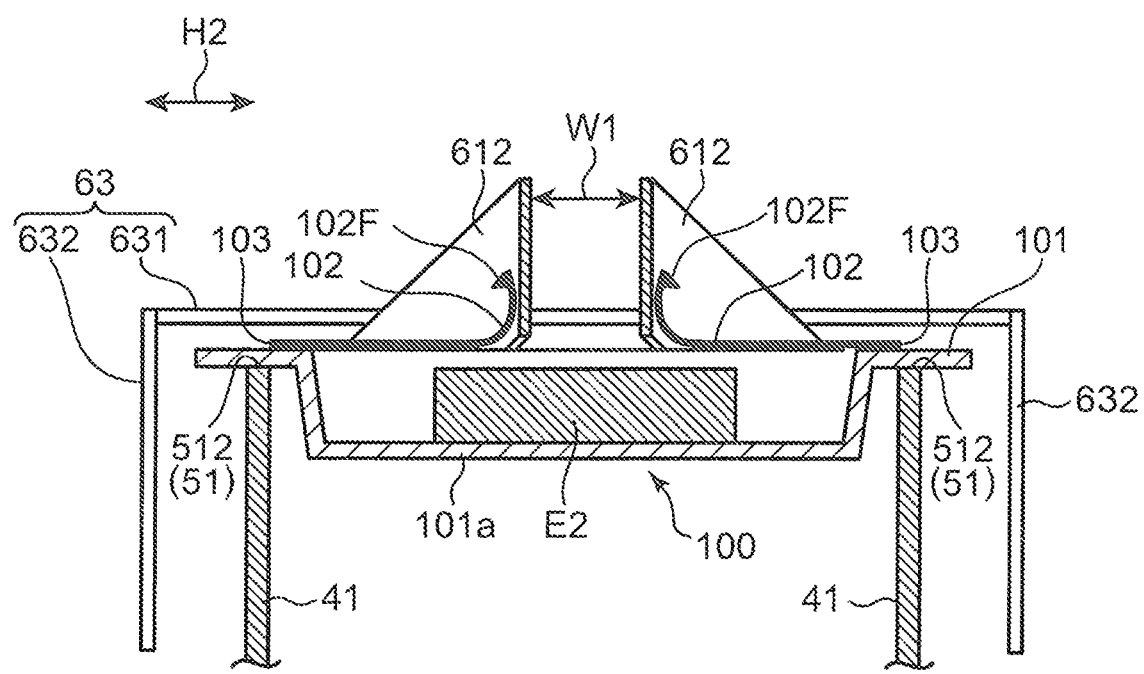
FIG. 13 is a sectional view of the cover tape post-processing portion of FIG. 12, the sectional view being taken along a XIII-XIII section line.
Figure 14:
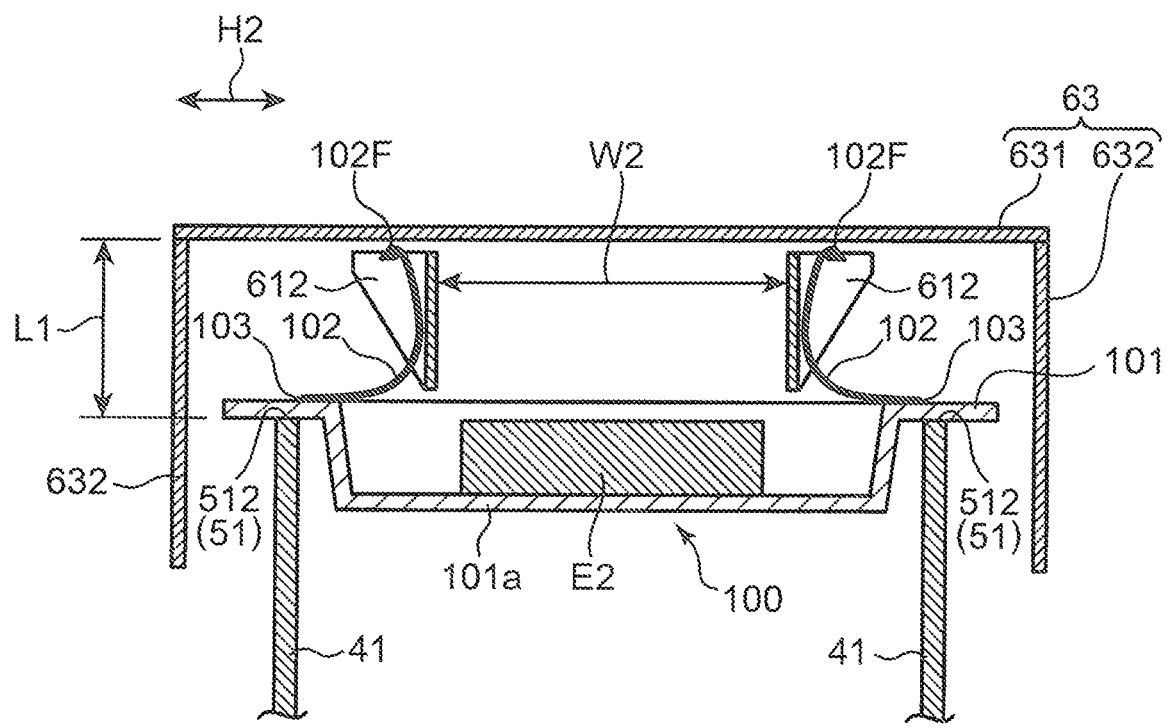
FIG. 14 is a sectional view of the cover tape post-processing portion of FIG. 12, the sectional view being taken along a XIV-XIV section line.
Figure 15:
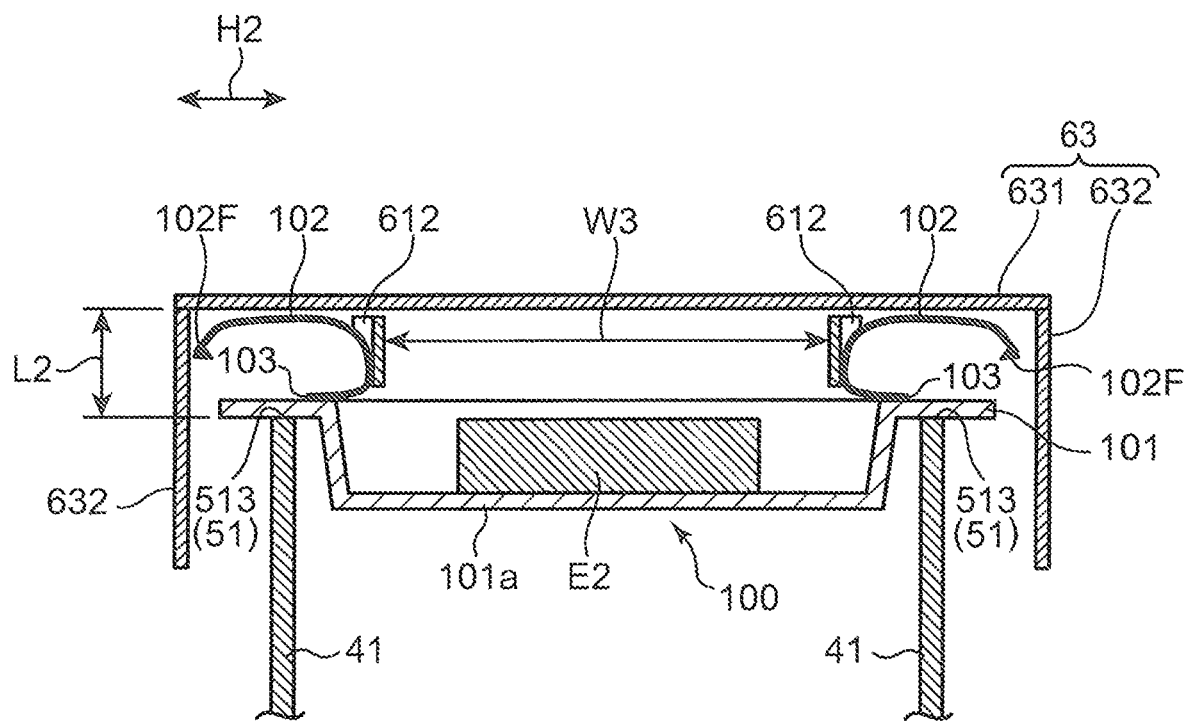
FIG. 15 is a sectional view of the cover tape post-processing portion of FIG. 12, the sectional view being taken along a XV-XV section line.
Figure 16:
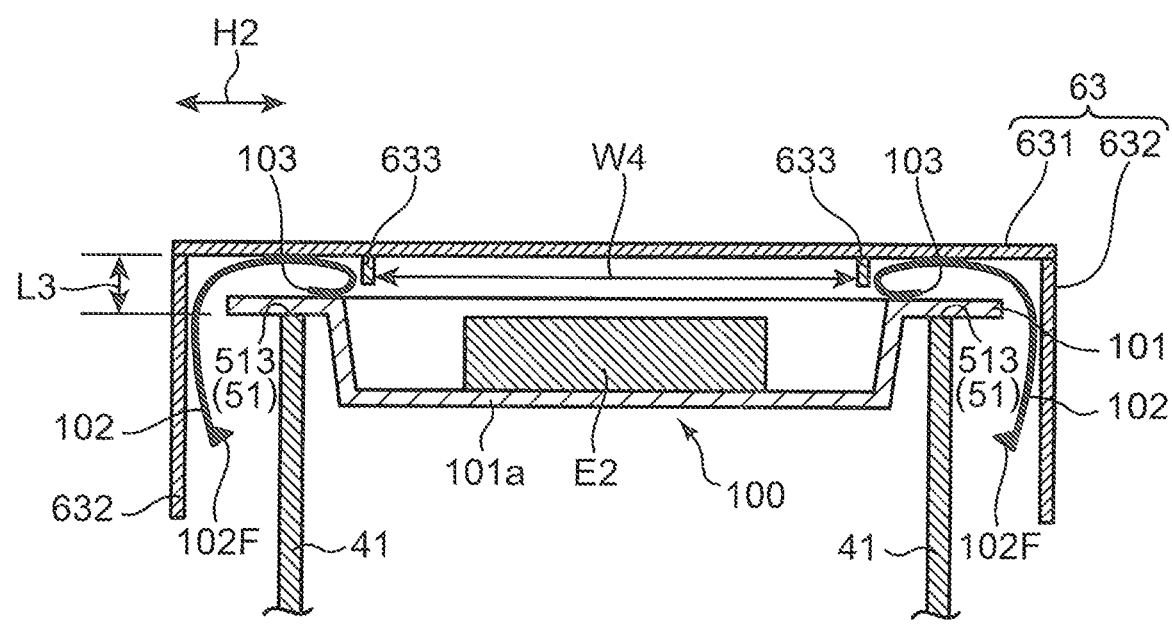
FIG. 16 is a sectional view of the cover tape post-processing portion of FIG. 12, the sectional view being taken along a XVI-XVI section line.

A configuration of the component exposing unit 6 included in the component feeding device 1 will then be described in detail with reference to FIG. 7 and FIGS. 8 to 16. FIG. 8 is a perspective view of a configuration of the cover tape pre-processing portion 62 of the component exposing unit 6. FIG. 9 is a perspective view of a configuration of the cover tape lifting portion 61 of the component exposing unit 6. FIG. 10 is a perspective view of a configuration of the cover tape post-processing portion 63 of the component exposing unit 6. FIG. 11 is a side view of the cover tape post-processing portion 63. FIG. 12 is a top plan view of the cover tape post-processing portion 63. FIG. 13 is a sectional view of the cover tape post-processing portion 63 of FIG. 12, the sectional view being taken along a XIII-XIII section line. FIG. 14 is a sectional view of the cover tape post-processing portion 63 of FIG. 12, the sectional view being taken along a XIV-XIV section line. FIG. 15 is a sectional view of the cover tape post-processing portion 63 of FIG. 12, the sectional view being taken along a XV-XV section line. FIG. 16 is a sectional view of the cover tape post-processing portion 63 of FIG. 12, the sectional view being taken along a XVI-XVI section line. Positions at which the cover tape post-processing portion 63 is cut to take the sectional views of FIGS. 13 to 16 are in the order of heading from the upstream side toward the downstream side in the tape send-off direction H1, that is, FIG. 13, FIG. 14, FIG. 15, and FIG. 16 represent the sectional views taken in order at those positions.

As described above, the cover tape pre-processing portion 62 is disposed between the pair of guide walls 41 such that the cover tape pre-processing portion 62 corresponds to the second guide surface portions 52 of the guide surfaces 5. Before the cover tape lifting portion 61 carries out the lifting process of lifting the cover tape 102, the cover tape pre-processing portion 62 carries out the pre-processing of cutting the cover tape 102 on the component storage tape 100, which is sent off by the first tape send-off portion 31 and travels on the second guide surface portions 52 as the tip end of the component storage tape 100 is provided as a free end. As shown in FIG. 8, the cover tape pre-processing portion 62 includes an insertion member 621, a cover tape cutting portion 622, and a support portion 623.

The insertion member 621 is a member that is inserted between the cover tape 102 and the carrier tape 101 of the component storage tape 100, which is sent off by the first tape send-off portion 31 and travels on the second guide surface portions 52 as the tip end of the component storage tape 100 is provided as a free end. The insertion member 621 is formed into a plate-like shape. The insertion member 621 has a base portion 6211, and an insertion front end 6212 continuous with an upstream end in the tape send-off direction H1 of the base portion 6211. To a downstream end 6211a in the tape send-off direction H1 of the base portion 6211 of the insertion member 621, a lid member 8, which will be described later, is connected.

In the insertion member 621, the insertion front end 6212 slopes upward against the base portion 6211 such that the insertion front end 6212 tilts upward (toward the +Z-side) from its part connected to the base portion 6211 toward a front edge 6212a, which is an upstream end in the tape send-off direction H1. In other words, in a state in which the insertion member 621 is inserted between the cover tape 102 and the carrier tape 101, the base portion 6211 is substantially parallel with the cover tape 102, and the insertion front end 6212 slopes upward in such a way as to separate from the carrier tape 101 across a gap and head to the cover tape 102.

The insertion front end 6212 of the insertion member 621 is made into the above sloped structure. This prevents a case where when the component storage tape 100 with the insertion member 621 being inserted between the cover tape 102 and the carrier tape 101 is sent off by the first tape send-off portion 31, the insertion front end 6212 comes in contact with a storage portion connection area located between adjacent component storage portions 101a of the carrier tape 101. As a result, smooth traveling of the component storage tape 100 is maintained to allow efficient transfer of the component E2 to the component take-out position 21.

The insertion front end 6212 of the insertion member 621 is formed into a tapered shape such that the insertion front end 6212 tapers off toward its front edge 6212a to reduce in width. On the component storage tape 100 in which the insertion member 621 is inserted, triangular fold pieces 102F are formed on a tip end 102T of the cover tape 102, as shown in FIG. 4. These fold pieces 102F facilitate insertion of the insertion member 621 between the cover tape 102 and the carrier tape 101.

The insertion member 621 is supported by the support portion 623. According to this embodiment, the support portion 623 is disposed on an upper surface of the lid member 8 (which will be described later) connected to the downstream end 6211a in the tape send-off direction H1 of the base portion 6211 of the insertion member 621, and is fixed to the device body 2. In this configuration, the support portion 623 supports the insertion member 621 via the lid member 8.

The cover tape cutting portion 622 cuts the cover tape 102 of the component storage tape 100, which is sent off by the first tape send-off portion 31 and travels on the second guide surface portions 52 as the tip end of the component storage tape 100 is provided as a free end. The cover tape cutting portion 622 cuts the cover tape 102 at a given position (e.g., central position) between both ends in the width direction of the cover tape 102. A cut part 102a (see FIG. 7) of the cover tape 102 cut by the cover tape cutting portion 622 extends linearly along the guide surfaces 5.

The cover tape cutting portion 622 includes a cutter 6221 that cuts the cover tape 102, and a holding portion 6222. The holding portion 6222 has a holding surface 6222a that holds the cutter 6221 in such a way as to expose its cutter edge.

The cover tape cutting portion 622 is supported by the support portion 623 via the lid member 8 such that, in an area 6222b of the holding portion 6222, the area 6222b at least being on the upstream side in the tape send-off direction H1, a surface opposite to the holding surface 6222a is in contact with an upper surface 6211b of the base portion 6211 of the insertion member 621. On the cover tape cutting portion 622, the cutter 6221 held by the holding surface 6222a of the holding portion 6222 faces upward (the +Z-side). According to this configuration, when the component storage tape 100 traveling on the second guide surface portions 52 passes the cover tape cutting portion 622, the insertion member 621 is interposed between an upstream end 6222c of the cover tape cutting portion 622 and the carrier tape 101. This prevents the upstream end 6222c of the cover tape cutting portion 622 from coming in contact with the component E2 stored in the component storage portion 101a of the carrier tape 101. A case where the component E2 is damaged by the cover tape cutting portion 622 coming in contact therewith, therefore, is prevented.

It is preferable that on the holding portion 6222 of the cover tape cutting portion 622, the holding surface 6222a be a sloped surface sloping downward from the downstream side to the upstream side in the tape send-off direction H1. In this configuration, when the component storage tape 100 travels on the second guide surface portions 52 and passes the cover tape cutting portion 622, the component storage tape 100 is guided along the holding surface 6222a of the holding portion 6222, the holding surface 6222a being formed as a sloped surface. As a result, traveling resistance that arises when the component storage tape 100 passes the cover tape cutting portion 622 can be reduced.

The insertion member 621 may be supported by the support portion 623 via the lid member 8 such that the insertion member 621 can be rocked around a given axis J1 extending in the X-axis direction (tape width direction H2). To allow the cover tape cutting portion 622 to rock in a motion interlocked with the rocking of the insertion member 621, the area 6222b of the holding portion 6222, the area 6222b at least being on the upstream side in the tape send-off direction H1, is set in contact with the upper surface 6211b of the base portion 6211 of the insertion member 621. Because of this configuration, for example, when the component storage tape 100 with a warp travels on the guide surfaces 5, the insertion member 621 and the cover tape cutting portion 622, which are inserted between the cover tape 102 and the carrier tape 101, are allowed to rock in response to the warp of the component storage tape 100. Thus, the case where the insertion front end 6212 of the insertion member 621 comes in contact with the storage portion connection area of the carrier tape 101 can be prevented in a steady manner.

As shown in FIG. 9, the cover tape lifting portion 61 is disposed between the pair of guide walls 41 such that the cover tape lifting portion 61 corresponds to the first guide surface portions 51 of the guide surfaces 5. On the component storage tape 100 traveling on the first guide surface portions 51, the cover tape lifting portion 61 comes in contact with the cut part 102a of the cover tape 102 cut by the cover tape cutting portion 622, thereby lifting the cover tape 102 off the carrier tape 101. The cover tape lifting portion 61 includes a lifting start portion 611 and a lifting extent adjusting portion 612.

The lifting start portion 611 makes up an upstream part in the tape send-off direction H1 of the cover tape lifting portion 61. The lifting start portion 611 has a contact starting point P1 at which contact with the cover tape 102 starts, and starts lifting of the cover tape 102 off the carrier tape 101 from the contact starting point P1. The cover tape lifting portion 61 is disposed such that the contact starting point P1 of the lifting start portion 611 is located at the midpoint between the pair of guide walls 41. In other words, the contact starting point P1 of the lifting start portion 611 is on the cut part 102a of the cover tape 102 cut by the cover tape cutting portion 622. On the cover tape lifting portion 61, the lifting start portion 611 is fixed to the lid member 8 described later.

On the tip end 102T of the cover tape 102, the tip end 102T being in contact with the contact starting point P1 of the lifting start portion 611, the triangular fold pieces 102F are formed, as shown in FIG. 4. This helps the lifting start portion 611 smoothly start the lifting of the cover tape 102.

On the cover tape lifting portion 61, the lifting extent adjusting portion 612 is continuous with a downstream end in the tape send-off direction H1 of the lifting start portion 611. The lifting extent adjusting portion 612 continuously increases an extent of lifting of the cover tape 102 off the carrier tape 101 as the component storage tape 100 travels on the first guide surface portions 51. As shown in FIG. 9, the lifting extent adjusting portion 612 is composed of a pair of lifting adjusting pieces 6121 and 6122. Each of the pair of lifting adjusting pieces 6121 and 6122 is a plate-like member that extends from a connection part, where the lifting adjusting piece is connected to the lifting start portion 611, to approach each of the guide walls 41. Downstream ends in the tape send-off direction H1 of the pair of lifting adjusting pieces 6121 and 6122 are in contact respectively with the joined portions 103 where the cover tape 102 is joined to the carrier tape 101, the joined portions 103 being formed on both ends in the tape width direction H2 of the cover tape 102.

On the lifting extent adjusting portion 612, a separation distance between the pair of lifting adjusting pieces 6121 and 6122 in the tape width direction H2 increases gradually from the upstream side toward the downstream side in the tape send-off direction H1. It is understood by referring to FIGS. 13 to 15 that the separation distance between the pair of lifting adjusting pieces 6121 and 6122 increases from the upstream side toward the downstream side in the tape send-off direction H1 in the order of a separation distance W1 (FIG. 13), a separation distance W2 (FIG. 14), and a separation distance W3 (FIG. 15). The pair of lifting adjusting pieces 6121 and 6122 making up the lifting extent adjusting portion 612 allow the continuous increase of the extent of lifting of the cover tape 102 off the carrier tape 101.

As described above, the first guide surface portions 51 of the guide surfaces 5, the first guide surface portions 51 bearing the cover tape lifting portion 61 placed thereon, are of curved shapes. Because of this, compared with a case of placing the cover tape lifting portion 61 on guide surfaces extending horizontally along the tape send-off direction H1, for example, the traveling distance of the component storage tape 100 that travels along the first guide surface portions 51 and passes the cover tape lifting portion 61 is increased. Besides, on the first guide surface portions 51, the lowermost downstream ends 513E in the tape send-off direction H1 are located below the uppermost upstream ends 511E. As a result, on the cover tape 102 having been subjected to the lifting process by the cover tape lifting portion 61, the development of a tensile stress acting in a direction of heading from the downstream end in the tape send-off direction H1 to the contact starting point P1 of the lifting start portion 611 is inhibited. Thus, buckling/deformation of the carrier tape 101 caused by the tensile stress of the cover tape 102 is prevented when the cover tape lifting portion 61 carries out the lifting process on the cover tape 102. As a result, smooth traveling of the component storage tape 100 is maintained to allow efficient transfer of the component E2 to the component take-out position 21.

As shown in FIG. 9, each of the pair of lifting adjusting pieces 6121 and 6122 making up the lifting extent adjusting portion 612 has a first adjusting piece 6123 and a second adjusting piece 6124 connected to a downstream end in the tape send-off direction H1 of the first adjusting piece 6123 via a connection member 613. The second adjusting piece 6124 is connected to the first adjusting piece 6123 in such a way as to be capable of rocking on the connection member 613. The pair of the lifting adjusting pieces 6121 and 6122 each having the first adjusting piece 6123 and the second adjusting piece 6124 are thus capable of rocking in response to a change in traveling behavior of the component storage tape 100 on the first guide surface portions 51. Thus, a drop in the steadiness of the lifting process of lifting the cover tape 102 by the pair of the lifting adjusting pieces 6121 and 6122 is prevented.

As described above, the first guide surface portions 51, on which the cover tape lifting portion 61 is placed, have the first curved areas 511 on the uppermost upstream side in the tape send-off direction H1, the second curved areas 512 continuous with the downstream side in the tape send-off direction H1 of the first curved areas 511, and the third curved areas 513 continuous with the downstream side in the tape send-off direction H1 of the second curved areas 512.

In a view in the X-axis direction (tape width direction H2), the curve of the first guide surface portions 51 in the Z-axis direction (vertical direction) in the first curved areas 511 and the same in the second curved areas 512 are different from each other. The sign of a curvature, therefore, changes in these curved areas 511 and 512. When the component storage tape 100 travels along such first guide surface portions 51, a force of causing the component storage tape 100 to warp in the Z-axis direction (vertical direction) acts on the component storage tape 100 and this force acts in opposite directions respectively in the first curved areas 511 and the second curved areas 512 when the component storage tape 100 passes these curved areas. For this reason, for example, when the cover tape lifting portion 61 is placed on the first guide surface portions 51 to lie across the first curved areas 511 and the second curved areas 512, it raises a possibility that the steadiness of the lifting process of lifting the cover tape 102 by the cover tape lifting portion 61 may drop.

To prevent such a case, the cover tape lifting portion 61 is disposed such that the contact starting point P1 of the lifting start portion 611 is located on a boundary S1 between the first curved areas 511 and the second curved areas 512 or located close to the boundary S1, as shown in FIG. 9. In such a configuration, the cover tape lifting portion 61 has the contact starting point P1 located on the boundary S1 between the first curved areas 511 and the second curved areas 512 or located close to the boundary S1, the contact starting point P1 being the uppermost upstream end of the cover tape lifting portion 61. The cover tape lifting portion 61, therefore, does not lie across the first curved areas 511 and the second curved areas 512 but lies on the second curved areas 512. Thus, a drop in the steadiness of the lifting process of lifting the cover tape 102 by the cover tape lifting portion 61 is prevented. On the cover tape lifting portion 61, the pair of lifting adjusting pieces 6121 and 6122 extend across the second curved areas 512 and the third curved areas 513 of the first guide surface portions 51 in the tape send-off direction H1.

When traveling on the first curved areas 511 and the second curved areas 512 of the first guide surface portions 51, the component storage tape 100 warps while traveling. The component storage tape 100 travels on the first guide surface portions 51 in a case where the component storage tape 100 is sent off by the first tape send-off portion 31 disposed on the upstream side of the first guide surface portions 51 and in another case where the component storage tape 100 is sent off by the second tape send-off portion 32 disposed on the downstream side of the first guide surface portions 51. In both cases, the direction of warp of the component storage tape 100 during traveling changes when the component storage tape 100 passes a point of curvature change, i.e., a boundary between the first curved areas 511 and the second curved areas 512, and, consequently, traveling behavior of the component storage tape 100 on the first guide surface portions 51 changes. Specifically, the component storage tape 100 sent off by the first tape send-off portion 31 warps upward (toward the +Z-side) on the first curved areas 511 and warps downward (toward the −Z-side) on the second curved areas 512. The component storage tape 100 sent off by the second tape send-off portion 32, on the other hand, warps downward (toward the −Z-side) on the first curved areas 511 and warps upward (toward the +Z-side) on the second curved areas 512.

As described above, according to the cover tape lifting portion 61 of this embodiment, only the lifting start portion 611 is fixed to the lid member 8, which will be described later, and the second adjusting pieces 6124 are connected to the first adjusting pieces 6123 in such a way as to be capable of rocking on the connection members 613, respectively. Because of this configuration, the cover tape lifting portion 61 can rock in response to a change in traveling behavior of the component storage tape 100 on the first guide surface portions 51. Thus, a drop in the steadiness of the lifting process of lifting the cover tape 102 by the cover tape lifting portion 61 is prevented.

On the first guide surface portions 51, the third curved areas 513 continuous with the downstream side in the tape send-off direction H1 of the second curved areas 512, on which the cover tape lifting portion 61 is placed, are formed into upward curved shapes. On the lowermost downstream ends in the tape send-off direction H1 of the third curved areas 513, as described above, the second tape send-off portion 32 having the pair of second sprockets 321 is disposed. The third curved areas 513 are formed into the upward curved shapes so that when the holes 101b of the carrier tape 101 are fitted to the teeth 321a of the pair of second sprockets 321 on the tip end of the component storage tape 100, which is sent off by the first tape send-off portion 31 and travels on the third curved areas 513, fitting the holes 101b to the teeth 321a is facilitated.

The lid member 8 included in the component feeding device 1 will then be described. The lid member 8 is a member that covers at least a part of each of openings of the component storage portions 101a of the component storage tape 100 having been subjected to the exposing process by the component exposing unit 6, the exposing process being carried out to expose the component E2 in the component storage portion 101a. In a configuration in which the component feeding device 1 includes the lid member 8, the lid member 8 prevents the component E2 from leaping out of the component storage portion 101a when the component storage tape 100 having been subjected to the exposing process is sent off by the tape send-off unit 3. The component feeding device 1, therefore, is allowed to steadily perform transfer of the component to the component take-out position 21.

According to this embodiment, the lid member 8 extends from the downstream end 6211a in the tape send-off direction H1 of the base portion 6211 of the insertion member 621 to the component take-out position 21 along the guide surfaces 5. The lid member 8, which is connected to the downstream end 6211a of the base portion 6211 of the insertion member 621, is inserted between the cover tape 102 and the carrier tape 101 of the component storage tape 100 sent off by the tape send-off unit 3. In this state, the lid member 8 covers the component storage portion 101a along the guide surfaces 5. The lid member 8 thus has a function of guiding the component storage tape 100 in its traveling, the component storage tape 100 being sent off by the tape send-off unit 3, while being inserted between the cover tape 102 and the carrier tape 101.

As mentioned above, when the component storage tape 100 travels on the first curved areas 511 and the second curved areas 512 of the first guide surface portions 51, the component storage tape 100 warps while traveling. This raises a possibility that, on the component storage tape 100 traveling on the first curved areas 511 and the second curved areas 512 of the first guide surface portions 51, a frictional force created by contact between the lid member 8, which covers the component storage portion 101a, and the carrier tape 101 may increase.

It is therefore preferable that the lid member 8 be a member having flexibility. In a configuration in which the lid member 8 is a flexible member, when the component storage tape 100 warps while traveling on the first curved areas 511 and the second curved areas 512 of the first guide surface portions 51, the lid member 8 warps in response to the warp of the component storage tape 100. As a result, on the component storage tape 100 traveling on the first curved areas 511 and the second curved areas 512 of the first guide surface portions 51, an increase in the frictional force created by contact between the lid member 8, which covers the component storage portion 101a, and the carrier tape 101 can be suppressed. Traveling resistance that arises when the component storage tape 100 travels on the guide surfaces 5, therefore, can be reduced. It is also preferable that the lid member 8 be made of a metal so that no static electricity is generated by the lid member 8. The lid member 8 may be of a structure in which a conductive layer is formed on the surface of a base material made of plastic or the like.

On the component exposing unit 6, the cover tape post-processing portion 63 is disposed on the upper side (+Z-side) relative to the cover tape lifting portion 61. The cover tape post-processing portion 63 pushes lifted parts of the cover tape 102 lifted by the cover tape lifting portion 61 to outside of respective side edges in the tape width direction H2 of the component storage tape 100 while folding the lifted parts downward (toward the −Z-side) to make the component storage portion 101a open to the outside. As shown in FIGS. 10 to 16, the cover tape post-processing portion 63 includes an upper regulating portion 631 and side regulating portions 632.

On the cover tape post-processing portion 63, the upper regulating portion 631 is set above and facing the first guide surface portions 51 of the guide surfaces 5 across a gap. The upper regulating portion 631 carries out first post-processing of regulating the upward movement of lifted parts of the cover tape 102 lifted by the cover tape lifting portion 61 while pushing the lifted parts of the cover tape 102 to outside of respective side edges in the tape width direction H2 of the component storage tape 100 to make the component storage portion 101a open to the outside. The gap between the upper regulating portion 631 and the first guide surface portions 51 of the guide surfaces 5 is determined such that the gap becomes narrower as it extends from the upstream side to the downstream side in the tape send-off direction H1. It is understood by referring to FIGS. 14 to 16 that the gap between the upper regulating portion 631 and the first guide surface portions 51 becomes narrower to take three forms of gaps L1 (FIG. 14), L2 (FIG. 15), and L3 (FIG. 16) in the size decreasing order as the gap extends from the upstream side to the downstream side in the tape send-off direction H1. In this configuration, the upper regulating portion 631 can push the lifted parts of the cover tape 102 to the outside such that an extent of outward movement of the lifted parts toward respective side edges in the tape width direction H2 of the cover tape 102 increases in response to a continuous increase in an extent of lifting by the lifting extent adjusting portion 612. As a result, the component storage portion 101a can be opened to the outside effectively, which facilitates taking out the component E2 at the component take-out position 21.

The upper regulating portion 631 has an upper regulation starting point P2 (see FIGS. 11 and 12), which serves as a point of starting regulation of the upward movement of the cover tape 102 lifted by the cover tape lifting portion 61. On the tip end 102T of the cover tape 102, the tip end 102T coming in contact with the upper regulation starting point P2 of the upper regulating portion 631, the triangular fold pieces 102F (see FIG. 4) are formed, as shown in FIG. 14. This allows the upper regulating portion 631 to smoothly push outward the lifted parts of the cover tape 102 lifted by the cover tape lifting portion 61.

According to this embodiment, as shown in FIGS. 10 and 11, the upper regulating portion 631 has a first upper regulating area 6311 and a second upper regulating area 6312. The first upper regulating area 6311 is counter to the second curved areas 512 of the first guide surface portions 51 and extends from the upstream side to the downstream side in the tape send-off direction H1, as a downward slope. The second upper regulating area 6312 is continuous with the downstream side in the tape send-off direction H1 of the first upper regulating area 6311. The second upper regulating area 6312 is counter to the third curved areas 513 of the first guide surface portions 51 and extends horizontally along the tape send-off direction H1. In this configuration, a gap between the first upper regulating area 6311 of the upper regulating portion 631 and the second curved areas 512 of the first guide surface portions 51 becomes narrower in correspondence to the downward slope of the first upper regulating area 6311. A gap between the second upper regulating area 6312 of the upper regulating portion 631 and the third curved areas 513 of the first guide surface portions 51, on the other hand, becomes narrower in correspondence to the upward curved shapes of the third curved areas 513. In other words, the gap between the upper regulating portion 631 and the first guide surface portions 51 can be determined such that the gap becomes narrower as it extends from the upstream side to the downstream side in the tape send-off direction H1.

On a lower surface (surface counter to the first guide surface portions 51) of the second upper regulating area 6312 of the upper regulating portion 631, a pair of lifting extent adjusting auxiliary pieces 633 are formed as projections on a downstream end in the tape send-off direction H1, as shown in FIGS. 11, 12, and 16. The pair of lifting extent adjusting auxiliary pieces 633 are plate-like projections that project from downstream ends of the pair of lifting adjusting pieces 6121 and 6122 to approach the pair of guide walls 41, respectively, while extending from the upstream side to the downstream side in the tape send-off direction H1. A separation distance between the pair of lifting extent adjusting auxiliary pieces 633 along the tape width direction H2 increases gradually as the lifting extent adjusting auxiliary pieces 633 extend from the upstream side to the downstream side in the tape send-off direction H1. A separation distance W4 between the pair of lifting extent adjusting auxiliary pieces 633 (FIG. 16) is larger than a separation distance W3 between the pair of lifting adjusting pieces 6121 and 6122 on their downstream side (FIG. 15). On the downstream side of the pair of lifting adjusting pieces 6121 and 6122, the pair of lifting extent adjusting auxiliary pieces 633 continuously increase the extent of lifting of the cover tape 102.

On the cover tape post-processing portion 63, the side regulating portions 632 are extended downward from both ends in the width direction of the upper regulating portion 631, respectively, such that the side regulating portions 632 face the side end faces of the component storage tape 100, respectively, from the outside of the pair of guide walls 41 in the tape width direction H2. The side regulating portions 632 carry out second post-processing of regulating the sidewise movement of the lifted parts of the cover tape 102, the lifted parts being pushed to outside of respective side edges in the tape width direction H2 of the component storage tape 100 by the upper regulating portion 632, while folding the lifted parts downward.

When the lifted parts of the cover tape 102 pushed outward by the upper regulating portion 631 are folded downward by the side regulating portions 632, the carrier tape 101 may possibly buckle or deform. To prevent such a case, the cover tape post-processing portion 63 is configured such that a side regulation starting point P3 (see FIGS. 11 and 12), which serves as a point of starting the downward folding of the lifted parts of the cover tape 102 by the side regulating portions 632, is located in the second upper regulating area 6312 of the upper regulating portion 631, the second upper regulating area 6312 extending horizontally in the tape send-off direction H1. This inhibits the buckling or deformation of the carrier tape 101 when the lifted parts of the cover tape 102 are folded downward from the side regulation starting point P3.

On the tip end 102T of the cover tape 102, the tip end 102T coming in contact with the side regulation starting point P3 of the side regulating portions 632, the triangular fold pieces 102F are formed, as shown in FIG. 15 (see FIG. 4). This allows the side regulating portions 632 to smoothly fold the lifted parts of the cover tape 102 downward, the lifted parts being pushed to outside of respective side edges in the tape width direction H2 of the component storage tape 100 by the upper regulating portion 631.

Figure 17:
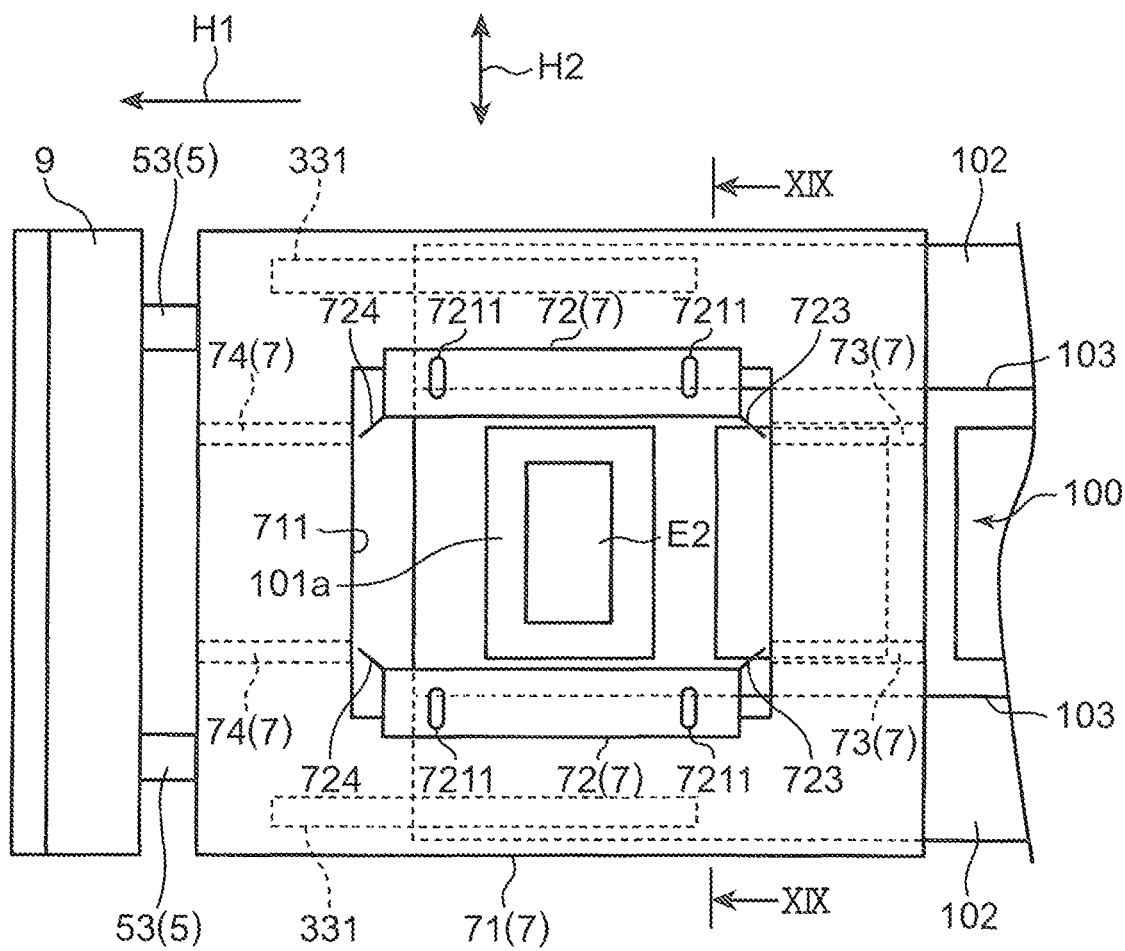
FIG. 17 is a top plan view of a tape traveling guide unit included in the component feeding device.
Figure 18:
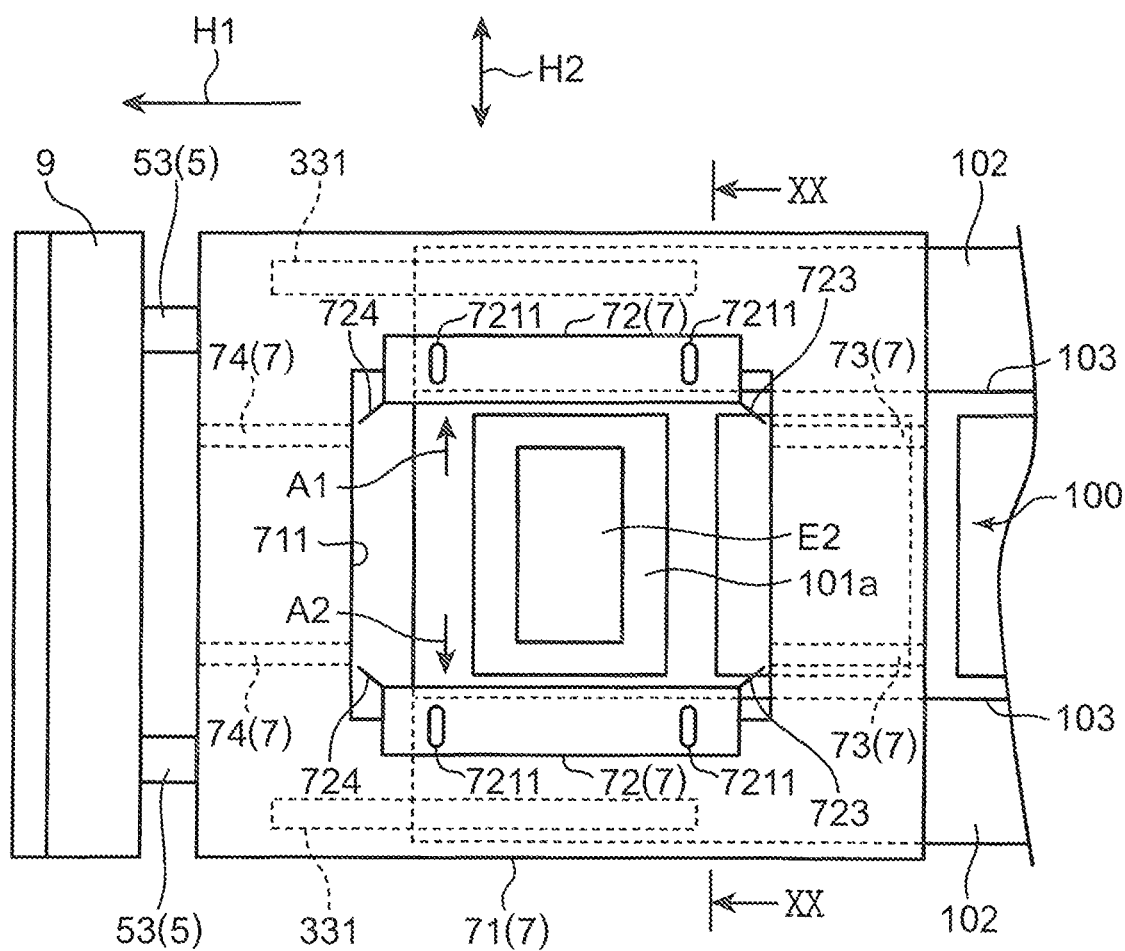
FIG. 18 is a plan view of the tape traveling guide unit, showing a state in which opening width defining members have shifted in position.
Figure 19:
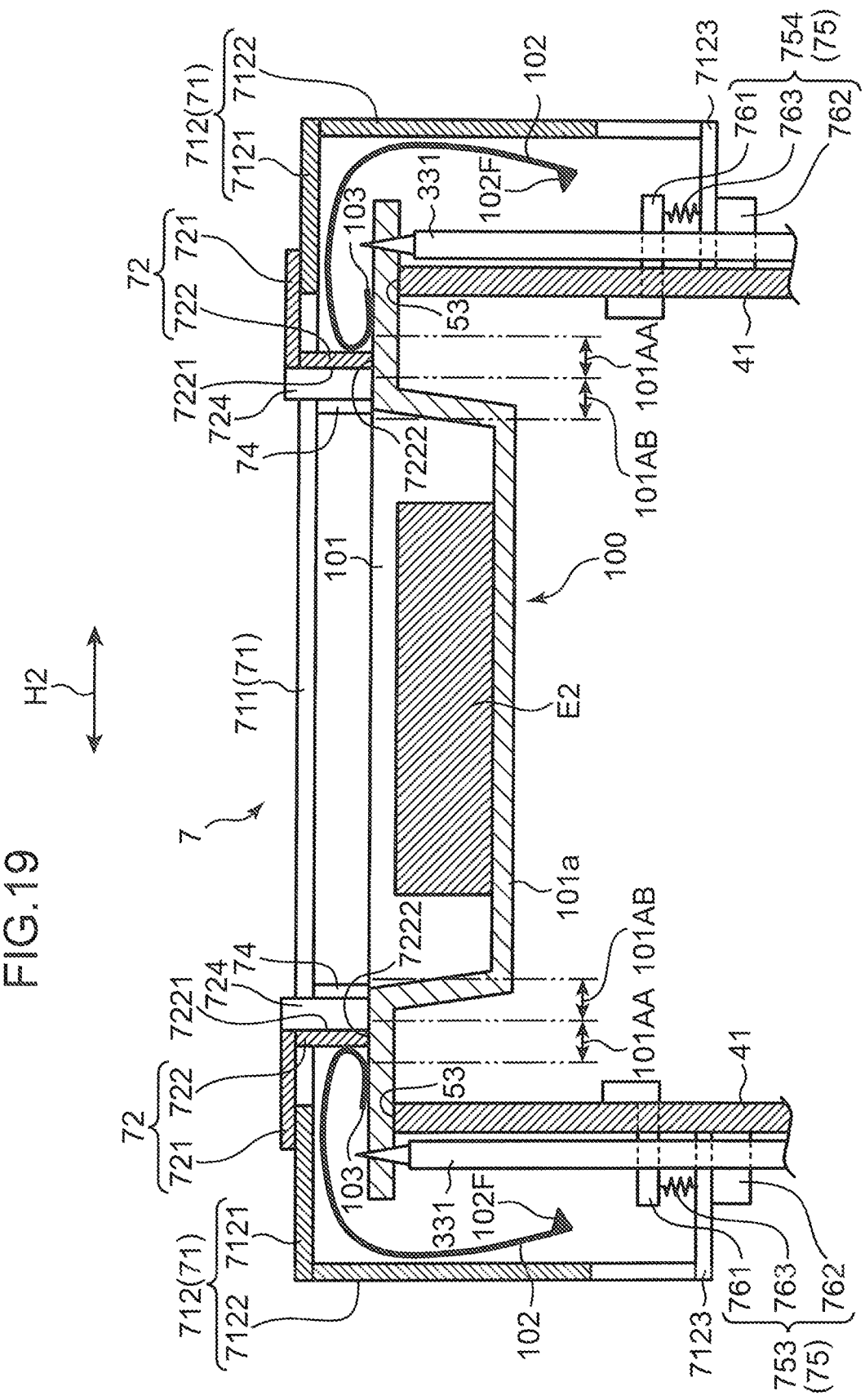
FIG. 19 is a sectional view of the tape traveling guide unit of FIG. 17, the sectional view being taken along a XIX-XIX section line.
Figure 20:
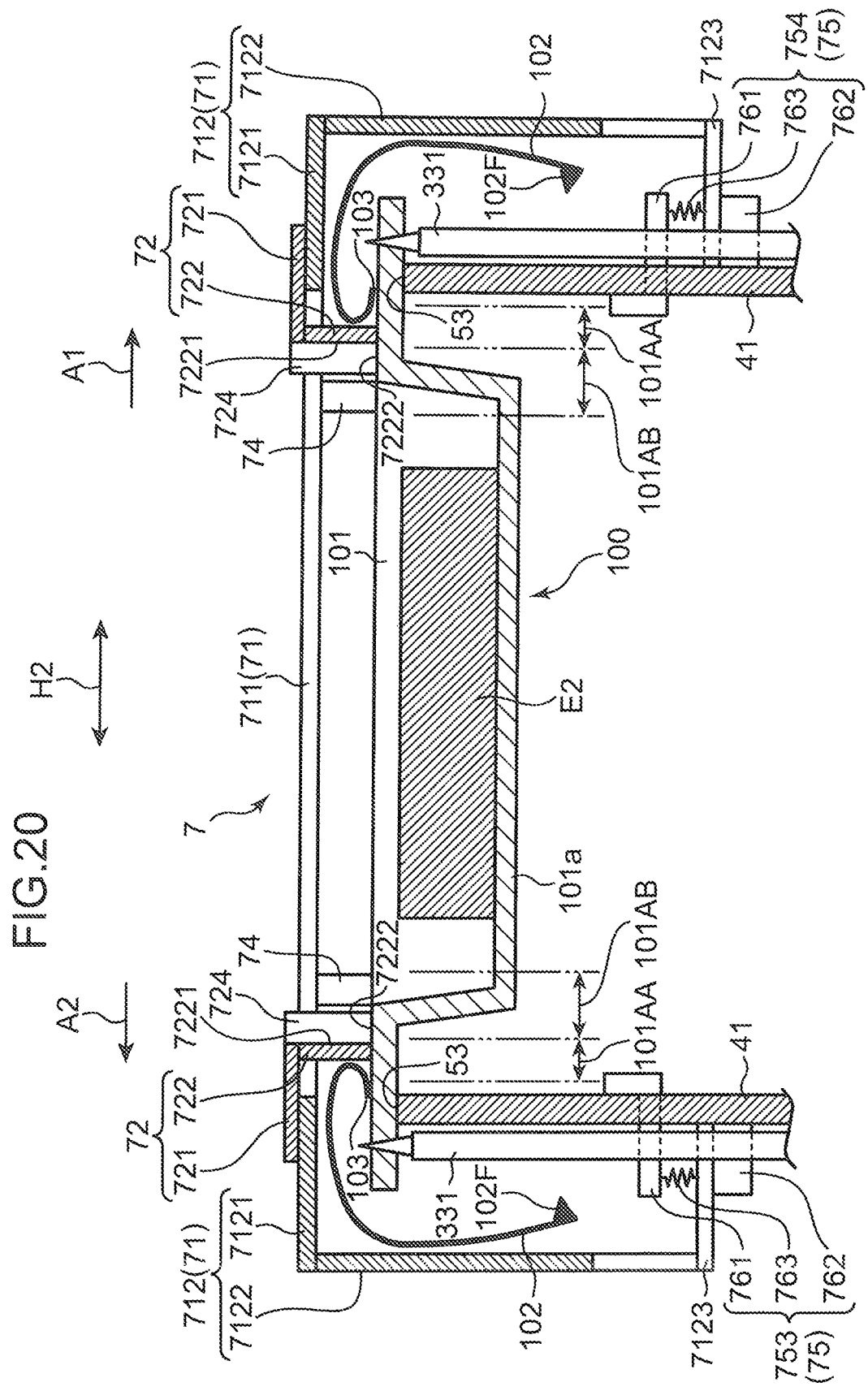
FIG. 20 is a sectional view of the tape traveling guide unit of FIG. 18, the sectional view being taken along a XX-XX section line.
Figure 21:
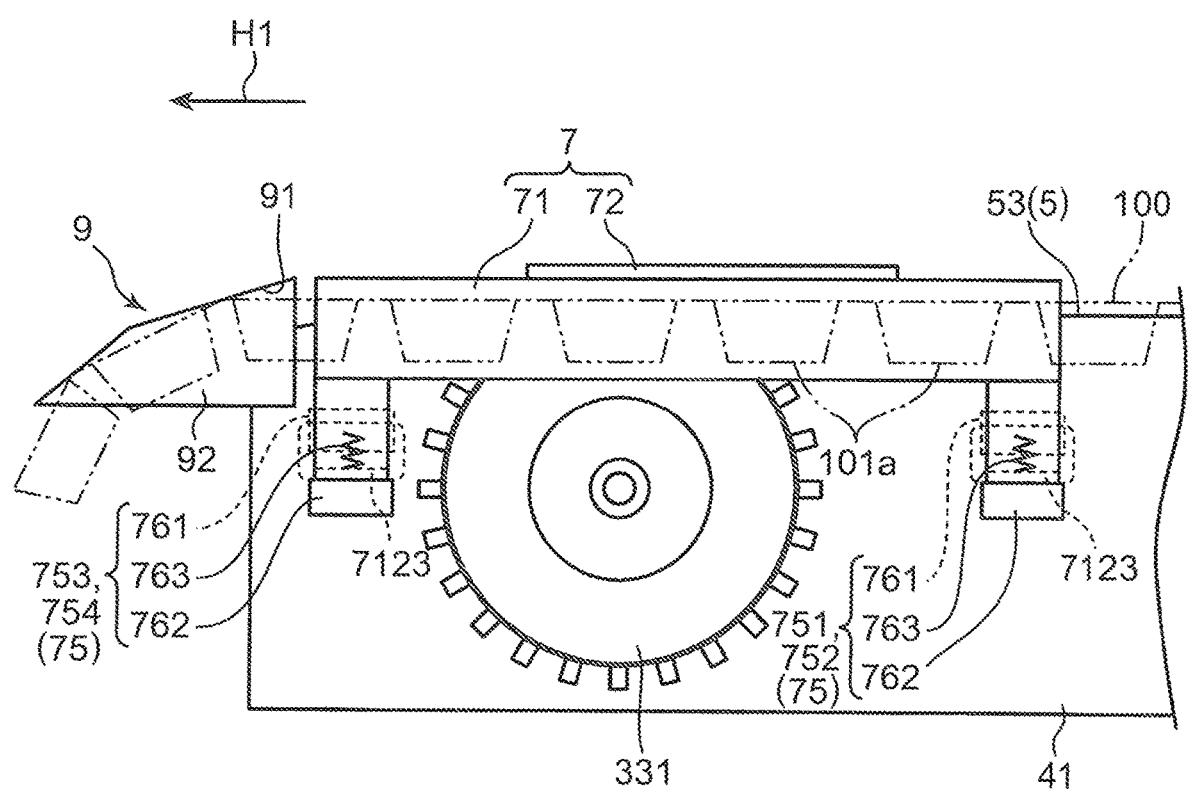
FIG. 21 is a side view of the tape traveling guide unit.
Figure 22:
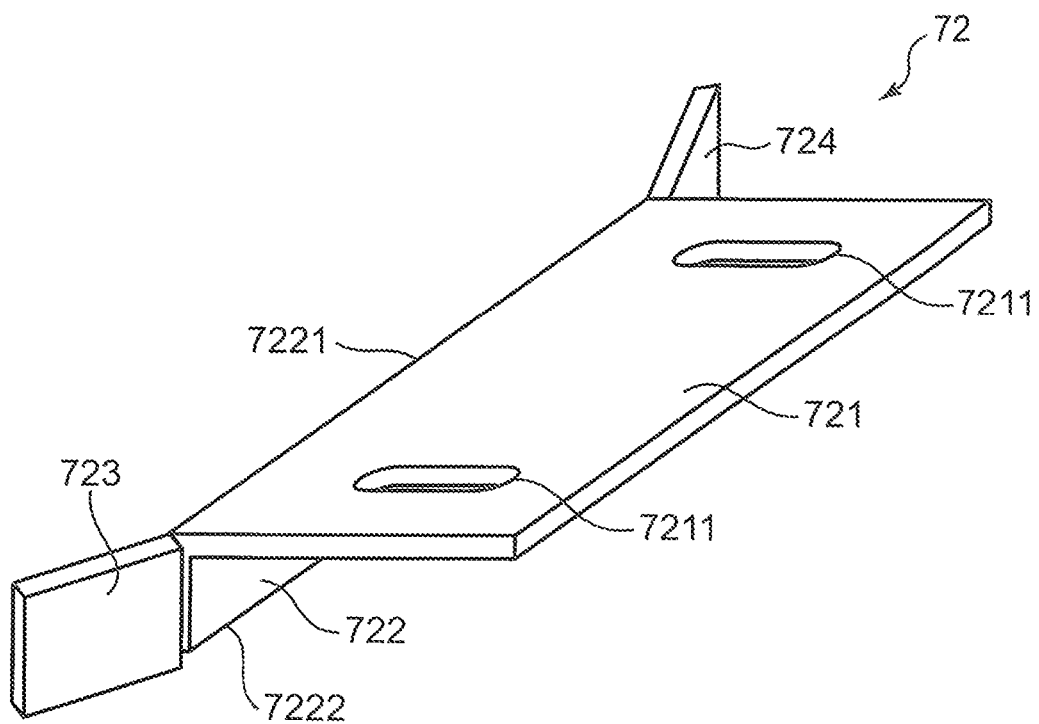
FIG. 22 is a perspective view of each of the opening width defining members of the tape traveling guide unit.
Figure 23:
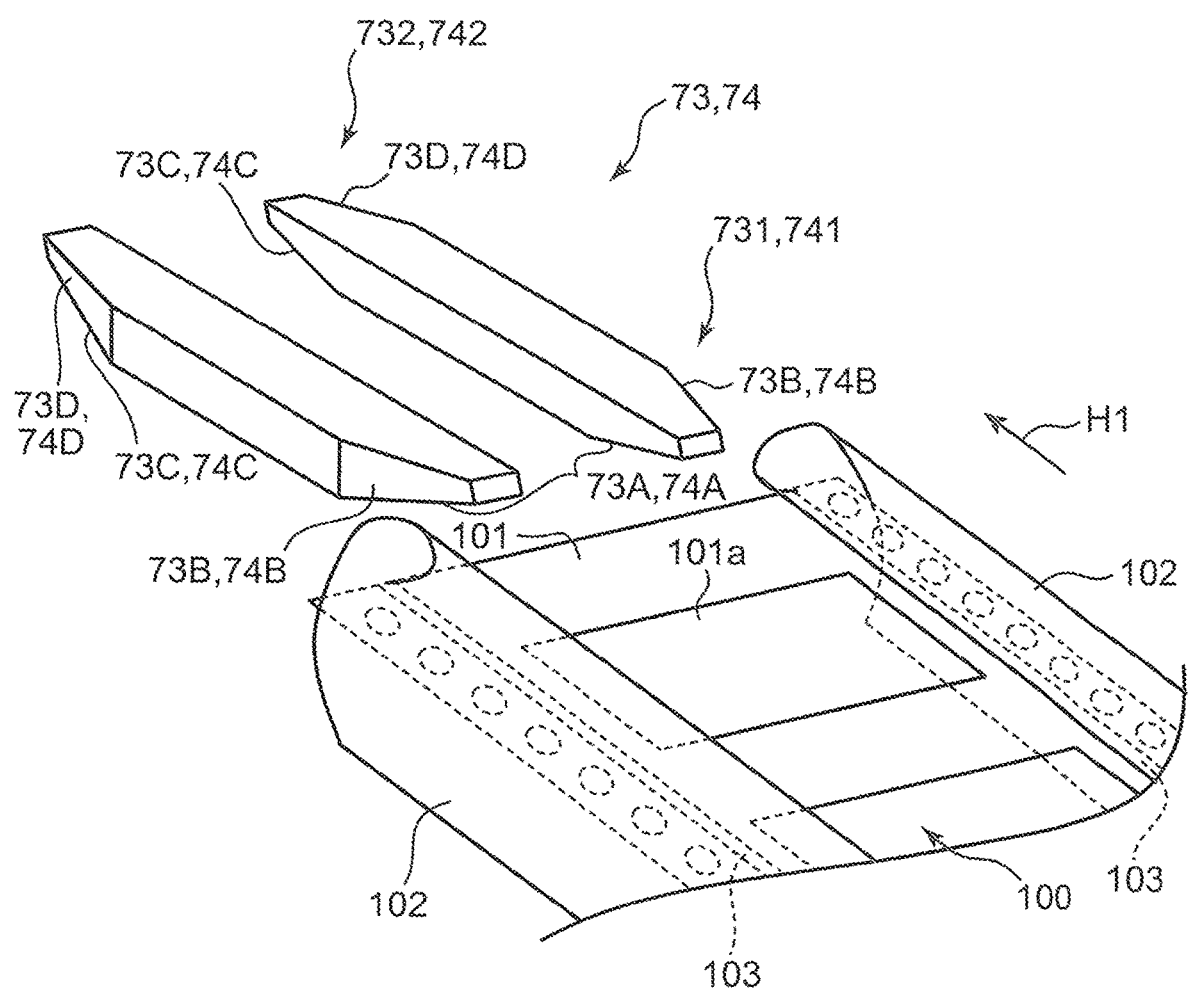
FIG. 23 is a perspective view of tape guide-in portions and tape guide-out portions of the tape traveling guide unit.

The tape traveling guide unit 7 included in the component feeding device 1 will then be described with reference to FIGS. 17 to 23. FIG. 17 is a top plan view of the tape traveling guide unit 7. FIG. 18 is a plan view of the tape traveling guide unit 7, showing a state in which opening width defining members 72 have shifted in position. FIG. 19 is a sectional view of the tape traveling guide unit 7 of FIG. 17, the sectional view being taken along a XIX-XIX section line. FIG. 20 is a sectional view of the tape traveling guide unit 7 of FIG. 18, the sectional view being taken along a XX-XX section line. FIG. 21 is a side view of the tape traveling guide unit 7. FIG. 22 is a perspective view of each of the opening width defining members 72 of the tape traveling guide unit 7. FIG. 23 is a perspective view of tape guide-in portions 73 and tape guide-out portions 74 of the tape traveling guide unit 7.

At the downstream side in the tape send-off direction H1 of the component exposing unit 6, the tape traveling guide unit 7 is disposed on the horizontal areas 531 of the third guide surface portions 53 of the guide surfaces 5. In other words, the tape traveling guide unit 7 is located close to the component take-out position 21. The tape traveling guide unit 7 guides the component storage tape 100 having been subjected to the component exposing process by the component exposing unit 6 to help the component storage tape 100 in traveling on the third guide surface portions 53 toward the component take-out position 21. The tape traveling guide unit 7 includes a guide body 71 and opening width defining members 72.

On the tape traveling guide unit 7, the guide body 71 makes up the body of the tape traveling guide unit 7, and has an opening 711 and a cover tape path demarcating portion 712. On the component storage tape 100 traveling on the third guide surface portions 53, the opening 711 faces the component storage portion 101a made open to the outside by the component exposing process by the component exposing unit 6. The opening 711 is formed into a rectangular shape having a given length in the tape send-off direction H1. The opening 711 is located underneath the component take-out position 21. In other words, the head unit 14 of the component mounter 10 takes out the component E2, which is transferred to the component take-out position 21 by the component feeding device 1, through the opening 711.

The cover tape path demarcating portion 712 of the guide body 71 is disposed outside the opening 711 in the tape width direction H2. As shown in FIGS. 19 and 20, on the component storage tape 100 that travels on the third guide surface portions 53 after being subjected to the component exposing process by the component exposing unit 6, the cover tape path demarcating portion 712 defines cover tape paths through which the lifted parts of the cover tape 102 travel, the lifted parts being pushed outward in the tape width direction H2 along the joined portions 103, serving as starting points, where the cover tape 102 is joined to the carrier tape 101, and being folded downward. The cover tape path demarcating portion 712 has upper counter portions 7121, which are counter to the cover tape 102 from a location above the third guide surface portions 53 of the pair of guide walls 41, and side counter portions 7122, which are counter to the cover tape 102 from a location outside the pair of guide walls 41 in the tape width direction H2. The upper counter portions 7121 are plate-like structures extending outward horizontally from both opening edges in the tape width direction H2 of the opening 711. The side counter portions 7122 are plate-like structures extending downward from outside edges of the upper counter portions 7121.

On the tape traveling guide unit 7, the opening width defining members 72 are fitted respectively to both opening edges in the tape width direction H2 of the opening 711 of the guide body 71, and define the opening width in the tape width direction H2 of the opening 711. As shown in FIGS. 19 and 20, on the component storage tape 100 that travels on the third guide surface portions 53, each opening width defining member 72 comes in contact with a first specific area 101AA of the upper surface of the carrier tape 101, the first specific area 101AA being between the component storage portion 101a and the joined portion 103 in the tape width direction H2. Each opening width defining member 72 thus applies a downward pressure to the first specific area 101AA of the upper surface of the carrier tape 101.

Specifically, each opening width defining member 72 has a base 721 and an extended piece 722 extended downward from the base 721. The base 721 is formed into a rectangular plate-like shape extending along the opening edge in the tape width direction H2 of the opening 711, and is fitted to the upper counter portion 7121. In a top plan view, an inner edge in the tape width direction H2 of the base 721 is located within the opening 711. The extended piece 722 is formed into a rectangular plate-like shape, whose one long side is connected to the inner edge in the tape width direction H2 of the base 721. The extended piece 722 is extended downward from the inner edge of the base 721 and is inserted in the opening 711. In a state in which the extended piece 722 is inserted in the opening 711, a surface (surface located inside in the tape width direction H2) of the extended piece 722 serves as a defining surface 7221 (see FIGS. 19 and 20) that defines the opening width in the tape width direction H2 of the opening 711. In the state in which the extended piece 722 is inserted in the opening 711, a lower end face of the extended piece 722 serves as a pressure-applying surface 7222 (see FIGS. 19 and 20) that applies a pressure to the first specific area 101AA of the upper surface of the carrier tape 101. The extended piece 722 has also a function of regulating the inward displacement of the cover tape 102 in the tape width direction H2.

On the component storage tape 100 that travels on the third guide surface portions 53 after being subjected to the component exposing process by the component exposing unit 6, as described above, the lifted parts of the cover tape 102 are pushed outward in the tape width direction H2 relative to the carrier tape 101 and are folded downward. Because the cover tape 102 is in this state, when the component storage tape 100 traveling on the third guide surface portions 53 passes the tape traveling guide unit 7, a force that causes the cover tape 102 to rise acts on the tape traveling guide unit 7. When the cover tape path demarcating portion 712 of the guide body 71 applies an excessive force to the cover tape 102 to prevent it from rising, it may impair the steadiness of traveling of the component storage tape 100 on the third guide surface portions 53 and may also create a resistive force against traveling, which raises a possibility that the traveling performance of the component storage tape 100 may deteriorate.

To avoid such a case, on the tape traveling guide unit 7, each opening width defining member 72, which defines the opening width of the opening 711 serving as the opening for taking out the component E2, applies a downward pressure to the first specific area 101AA of the upper surface of the carrier tape 101. This ensures that the component storage tape 100 travels steadily on the third guide surface portions 53. Meanwhile, on the tape traveling guide unit 7, the cover tape path demarcating portion 712 of the guide body 71 does not put constraint on the cover tape 102 but rather allows the cover tape 102 to rise to some extent, thereby demarcating a path that embraces the cover tape 102. This reduces the traveling resistance that arises when the component storage tape 100 travels on the third guide surface portions 53, and improves the traveling performance of the component storage tape 100.

On the component storage tape 100, the length of the component storage portion 101a in the tape width direction H2 is determined in accordance with the size of the component E2 stored in the component storage portion 101a. In other words, on the component storage tape 100, the length of the component storage portion 101a in the tape width direction H2 varies depending on the size of the component E2 even when the tape width K2 remains the same. In FIGS. 17 to 20, FIGS. 17 and 19 depict one example of the length of the component storage portion 101a in the tape width direction H2 and FIGS. 18 and 20 depict another example of the same. In these examples, the length shown in FIGS. 18 and 20 is greater than the length shown in FIGS. 17 and 19. It is necessary for each opening width defining member 72 to define the opening width of the opening 711 in accordance with the length of the component storage portion 101a in the tape width direction H2. To meet this requirement, as shown in FIGS. 17 and 18, the base 721 of each opening width defining member 72 is fitted to the upper counter portion 7121 via fitting portions 7211 of elongated holes extending in the tape width direction H2. These fitting portions 7211 allow changing the position of the defining surface 7221 of the extended piece 722, which is extended downward from the base 721, in the tape width direction H2. Thus, the opening width defining member 72 can define the opening width of the opening 711 in accordance with the length of the component storage portion 101a in the tape width direction H2, using the defining surface 7221 of the extended piece 722. Specifically, when a component storage tape 100 having component storage portions 101a with a greater length in the tape width direction H2 is used, respective bases 721 of the opening width defining members 72 are fitted to the upper counter portions 7121 via the fitting portions 7211 such that, with respect to the tape width direction H2, the defining surface 7221 of one opening width defining member 72 is located at a position shifted in an outward direction A1 while the defining surface 7221 of the other opening width defining member 72 is located at a position shifted in an outward direction A2 (opposite to the direction A1) (see FIG. 20).

As shown in FIGS. 17 to 20, the tape traveling guide unit 7 further includes a pair of tape guide-in portions 73 and a pair of tape guide-out portions 74. Each of the pair of tape guide-in portions 73 is a bar-like member extending along the tape send-off direction H1. The pair of tape guide-in portions 73 are fitted to a part of guide body 71 that is on the upstream side in the tape send-off direction H1 of the opening 711 such that the tape guide-in portions 73 are separated in the tape width direction H2 across a gap. Each of the pair of tape guide-in portions 73 comes in contact with a second specific area 101AB located inward in the tape width direction H2 relative to the first specific area 101AA with which the pressure-applying surface 7222 of the extended piece 722 comes in contact, the second specific area 101AB being an area of the upper surface of the carrier tape 101. In this configuration, each of the pair of tape guide-in portions 73 guides the lifted part of the cover tape 102 into the cover tape path defined by the cover tape path demarcating portion 712 while regulating the inward displacement of the cover tape 102 in the tape width direction H2.

Each of the pair of tape guide-out portions 74 is a bar-like member extending along the tape send-off direction H1. The pair of tape guide-out portions 74 are fitted to a part of guide body 71 that is on the downstream side in the tape send-off direction H1 of the opening 711 such that the tape guide-out portions 74 are separated in the tape width direction H2 across a gap. Each of the pair of tape guide-out portions 74 comes in contact with the second specific area 101AB of the upper surface of the carrier tape 101. In this configuration, each of the pair of tape guide-out portions 74 guides the lifted part of the cover tape 102 out of the cover tape path defined by the cover tape path demarcating portion 712 while regulating the inward displacement of the cover tape 102 in the tape width direction H2.

As shown in FIGS. 17 to 20, each opening width defining member 72 further includes a first projection 723 projecting from an upstream end in the tape send-off direction H1 of the extended piece 722, and a second projection 724 projecting from a downstream end in the tape send-off direction H1 of the extended piece 722. The first projection 723 extends slantly toward a downstream end in the tape send-off direction H1 of the tape guide-in portion 73. The second projection 724 extends slantly toward an upstream end in the tape send-off direction H1 of the tape guide-out portion 74.

On the component storage tape 100 having traveled on the third guide surface portions 53 and passed the pair of tape guide-in portions 73, the lifted parts of the cover tape 102 come in contact with respective first projections 723 of the opening width defining members 72 and are guided into the cover tape paths defined by the cover tape path demarcating portion 712. In this manner, the lifted parts of the cover tape 102 of the component storage tape 100 having passed the pair of tape guide-in portions 73 are guided smoothly into the cover tape path demarcating portion 712.

Then, on the component storage tape 100 traveling on the third guide surface portion 53, the lifted parts of the cover tape 102 having passed through the cover tape path demarcating portion 712 come in contact with respective second projections 724 of the opening width defining members 72 and are guided to the tape guide-out portions 74. In this manner, the lifted parts of the cover tape 102 having passed through the cover tape path demarcating portion 712 can smoothly be guided out of the cover tape path demarcating portion 712.

The shape of the pair of tape guide-in portions 73 and the pair of tape guide-out portions 74 will be described with reference to FIG. 23.

Each of the pair of tape guide-in portions 73 includes a first tape guide-in tapered portion 731 of a tapered shape, which is formed on an upstream end in the tape send-off direction H1, and a second tape guide-in tapered portion 732 of a tapered shape, which is formed on a downstream end in the tape send-off direction H1. The first tape guide-in tapered portion 731 has a sloped surface 73A sloping upward toward a front edge (edge on the upstream side in the tape send-off direction H1), the sloped surface 73A being a lower surface of the first tape guide-in tapered portion 731, and a sloped surface 73B sloping inward in the tape width direction H2 toward the front edge (edge on the upstream side in the tape send-off direction H1), the sloped surface 73B being a side surface of first tape guide-in tapered portion 731 that is located on the outer side in the tape width direction H2. In this manner, the pair of tape guide-in portions 73 are configured to include the first tape guide-in tapered portions 731 formed respectively on their upstream ends in the tape send-off direction H1. In this configuration, the cover tape 102 of the component storage tape 100 having passed the component exposing unit 6 is guided smoothly to the pair of tape guide-in portions 73. The second tape guide-in tapered portion 732 has a sloped surface 73C sloping upward toward a front edge (edge on the downstream side in the tape send-off direction H1), the sloped surface 73C being a lower surface of the second tape guide-in tapered portion 732, and a sloped surface 73D sloping inward in the tape width direction H2 toward the front edge (edge on the downstream side in the tape send-off direction H1), the sloped surface 73D being a side surface of second tape guide-in tapered portion 732 that is located on the outer side in the tape width direction H2. In this manner, the pair of tape guide-in portions 73 are configured to include the second tape guide-in tapered portions 732 formed respectively on their downstream ends in the tape send-off direction H1. In this configuration, the cover tape 102 of the component storage tape 100 having passed the pair of tape guide-in portions 73 can smoothly be guided into the cover tape path demarcating portion 712.

Each of the pair of tape guide-out portions 74 includes a first tape guide-out tapered portion 741 of a tapered shape, which is formed on an upstream end in the tape send-off direction H1, and a second tape guide-out tapered portion 742 of a tapered shape, which is formed on a downstream end in the tape send-off direction H1. The first tape guide-out tapered portion 741 has a sloped surface 74A sloping upward toward a front edge (edge on the upstream side in the tape send-off direction H1), the sloped surface 74A being a lower surface of the first tape guide-out tapered portion 741, and a sloped surface 74B sloping inward in the tape width direction H2 toward the front edge (edge on the upstream side in the tape send-off direction H1), the sloped surface 74B being a side surface of first tape guide-out tapered portion 741 that is located on the outer side in the tape width direction H2. In this manner, the pair of tape guide-out portions 74 are configured to include the first tape guide-out tapered portions 741 formed respectively on their upstream ends in the tape send-off direction H1. In this configuration, the cover tape 102 having passed through the cover tape path demarcating portion 712 is guided smoothly by the pair of tape guide-out portions 74. The second tape guide-out tapered portion 742 has a sloped surface 74C sloping upward toward a front edge (edge on the downstream side in the tape send-off direction H1), the sloped surface 74C being a lower surface of the second tape guide-out tapered portion 742, and a sloped surface 74D sloping inward in the tape width direction H2 toward the front edge (edge on the downstream side in the tape send-off direction H1), the sloped surface 74D being a side surface of second tape guide-out tapered portion 742 that is located on the outer side in the tape width direction H2. In this manner, the pair of tape guide-out portions 74 are configured to include the second tape guide-out tapered portions 742 formed respectively on their downstream ends in the tape send-off direction H1. In this configuration, the cover tape 102 of the component storage tape 100 having passed the pair of tape guide-out portions 74 can smoothly be guided into the tape ejection guide unit 9, which will be described later.

As shown in FIGS. 19 to 21, the tape traveling guide unit 7 further includes a coupling mechanism 75 that couples the guide body 71 to the pair of guide walls 41 such that the guide body 71 is allowed to shift in position in the vertical direction (Z-axis direction). The coupling mechanism 75 has a first coupling portion 751 and a second coupling portion 752, and a third coupling portion 753 and a fourth coupling portion 754. The first coupling portion 751 and the second coupling portion 752 couple both ends in the tape width direction H2 of the guide body 71, the ends being on the upstream end side in the tape send-off direction H1, to the pair of guide walls 41, respectively. The third coupling portion 753 and the fourth coupling portion 754 couple both ends in the tape width direction H2 of the guide body 71, the ends being on the downstream end side in the tape send-off direction H1, to the pair of guide walls 41, respectively.

Each of the first coupling portion 751, the second coupling portion 752, the third coupling portion 753, and the fourth coupling portion 754 has an upper limit stopper 761, a lower limit stopper 762, and a biasing member 763. The upper limit stopper 761 is fitted to each of the pair of guide walls 41 and determines an upper limit position of the guide body 71 that shifts in position vertically (in the Z-axis direction). The lower limit stopper 762 is fitted to each of the pair of guide walls 41 in such a way as to be under the upper limit stopper 761 and determines a lower limit position of the guide body 71 that shifts in position vertically (in the Z-axis direction). The fitting position of the lower limit stopper 762 on each of the pair of guide walls 41 in the vertical direction (Z-axis direction) is determined so that the component storage tape 100 is allowed to travel on the third guide surface portions 53 as the upper surface of the carrier tape 101 is kept in contact with the extended pieces 722, the first projections 723, the second projections 724, the tape guide-in portions 73, and the tape guide-out portions 74. In other words, in a state in which the guide body 71 is stopped at its lower limit position by the lower limit stopper 762, a gap slightly larger than the thickness of the carrier tape 101 is formed between the extended pieces 722, the first projections 723, the second projections 724, the tape guide-in portions 73, and the tape guide-out portions 74 and the third guide surface portions 53.

The biasing member 763 is disposed between the upper limit stopper 761 and the lower limit stopper 762 and applies a downward pressure to the guide body 71 to allow it to shift in position vertically (in the Z-axis direction). The biasing member 763 is provided as, for example, a compression coil spring. The biasing member 763 has one end fixed to the upper limit stopper 761 and the other end fixed to a pressurized portion 7123 of the guide body 71. The pressurized portion 7123 is a projection projecting inward from a lower edge of the side counter portion 7122 of the cover tape path demarcating portion 712 of the guide body 71. The pressurized portion 7123 is disposed between the upper limit stopper 761 and the lower limit stopper 762 and receives a pressure applied by the biasing member 763.

On the tape traveling guide unit 7, the guide body 71 is coupled to the pair of guide walls 41 via the coupling mechanism 75 such that the guide body 71 can shift in position vertically. In this configuration, it is ensured that the component storage tape 100 travels steadily on the third guide surface portions 53 as the upper surface of the carrier tape 101 is kept in contact with the extended pieces 722, the first projections 723, the second projections 724, the tape guide-in portions 73, and the tape guide-out portions 74.

When the component E2 transferred to the component take-out position 21 is taken out by the head unit 14 through the opening 711 of the guide body 71, the component storage tape 100 is ejected out of the component feeding device 1. The component storage tape 100 having passed through the tape traveling guide unit 7 droops down when ejected out of the component feeding device 1. At this time, the component storage tape 100 is folded at the storage portion connection area between adjacent component storage portions 101a of the carrier tape 101 and droops down as a consequence. In this manner, the component storage tape 100 folded at the area between adjacent component storage portions 101a shows a tendency to bulge upward.

It is difficult to suppress an upward bulging motion of the component storage tape 100 by the downward pressure that the opening width defining members 72 of the tape traveling guide unit 7 applies to the carrier tape 101. Given this fact, it is possible that the upward bulging of the component storage tape 100 ejected out of the component feeding device 1 may lift the guide body 71 up. It is conceivable that to regulate such an upward positional shift of the guide body 71 caused by the upward bulging of the component storage tape 100, the downward pressure that the biasing members 763 of the coupling mechanism 75 apply to the guide body 71 may be increased. In this case, however, the increased downward pressure creates traveling resistance that hampers traveling of the component storage tape 100 on the third guide surface portions 53.

To avoid such a case, according to this embodiment, the component storage tape 100 is ejected out of the component feeding device 1 through the tape ejection guide unit 9. As shown in FIG. 21, on the downstream side in the tape send-off direction H1 of the tape traveling guide unit 7, the tape ejection guide unit 9 is fitted to downstream side ends in the tape send-off direction H1 of the pair of guide walls 41. The tape ejection guide unit 9 guides the component storage tape 100 having passed the tape traveling guide unit 7 to eject the component storage tape 100 on the downstream side. The tape ejection guide unit 9 includes an upper surface regulating portion 91 and side surface regulating portions 92.

On the tape ejection guide unit 9, the upper surface regulating portion 91 comes in contact with the upper surface of the component storage tape 100 having passed the tape traveling guide unit 7, thereby regulating an upward motion of the component storage tape 100. On the tape ejection guide unit 9, the side surface regulating portions 92 come in contact with side end faces of the component storage tape 100 having passed the tape traveling guide unit 7, thereby regulating a lateral motion of the component storage tape 100. In this manner, the upward bulging of the component storage tape 100 ejected out of the component feeding device 1 is suppressed.

The component feeding device and the component mounter according to the embodiment of the present disclosure have been described above. The present disclosure is, however, not limited to these component feeding device and the component mounter but may be embodied as the following modified embodiments.

First Modified Embodiment

Figure 24:
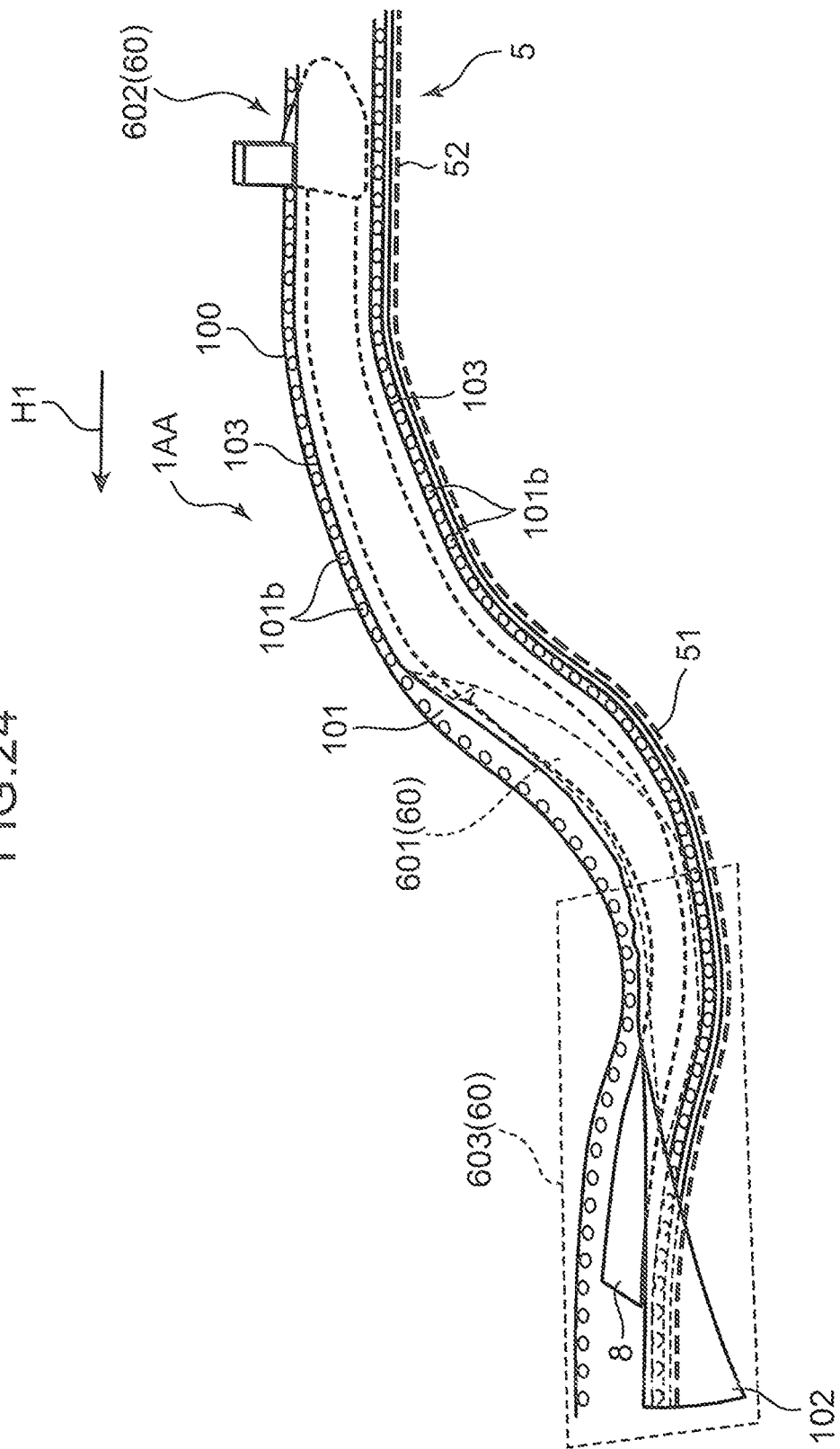
FIG. 24 is a perspective view of a component exposing unit of a cover tape separating type.

In the embodiment described above, the component exposing unit 6 of the component feeding device 1, the component exposing unit 6 being of the cover tape cutting type, includes the cover tape pre-processing portion 62 that cuts the cover tape 102 of the component storage tape 100. The present disclosure is, however, not limited to this configuration. As shown in FIG. 24, the component feeding device may be configured to include a component exposing unit 60 of a cover tape separating type. On a component feeding device 1AA shown in FIG. 24, the component exposing unit 60 lifts the cover tape 102 of the component storage tape 100, which travels as it is guided by the guide surfaces 5 of the pair of guide walls 41, along the joined portion 103 serving as a starting point, the joined portion 103 being on one side in the tape width direction, and pushes a lifted part of the cover tape 102 outward in the tape width direction while folding the lifted part downward to expose the component E2 in the component storage portion 101a.

The component exposing unit 60 of the cover tape separating type includes a cover tape lifting portion 601, a cover tape pre-processing portion 602, and a cover tape post-processing portion 603.

The cover tape lifting portion 601 is disposed between the pair of guide walls 41 such that the cover tape lifting portion 601 corresponds to the first guide surface portions 51 of the guide surfaces 5. The cover tape lifting portion 601 carries out a lifting process of lifting the cover tape 102 off the carrier tape 101 such that an extent of lifting the cover tape 102 off the carrier tape 101 increases continuously on the component storage tape 100, which travels as it is guided by the first guide surface portions 51. An upstream end in the tape send-off direction H1 of the cover tape lifting portion 601 is fixed to the lid member 8. The cover tape lifting portion 601 extends from the upstream side toward the downstream side in the tape send-off direction H1 in such a way as to head from one side to the other side in the tape width direction. In other words, on the cover tape lifting portion 601, a point of starting contact with the cover tape 102 is located on one end on one side in the tape width direction. On the cover tape lifting portion 601, a lowermost downstream end, which is a point of ending contact with the cover tape 102, is located on the other end on the other side in the tape width direction.

The cover tape pre-processing portion 602 is disposed between the pair of guide walls 41 such that the cover tape pre-processing portion 602 corresponds to the second guide surface portions 52 of the guide surfaces 5. Before the cover tape lifting portion 601 carries out the lifting process, the cover tape pre-processing portion 602 carries out pre-processing of separating the joined portion 103 where the cover tape 102 is joined to the carrier tape 101, the joined portion 103 being on the one end on the one side in the tape width direction of the cover tape 102.

The cover tape post-processing portion 603 is disposed on the upper side relative to the cover tape lifting portion 601 such that the cover tape post-processing portion 603 corresponds to the first guide surface portions 51 of the guide surfaces 5. The cover tape post-processing portion 603 carries out post-processing of pushing a lifted part of the cover tape 102 lifted by the cover tape lifting portion 601 to outside of a side edge in the tape width direction of the component storage tape 100, the side edge being on the side opposite to the side on which the cover tape 102 is separated by the cover tape pre-processing portion 602, while folding the lifted part downward to make the component storage portion 101a open to the outside.

According to the component exposing unit 60 of the cover tape separating type, the cover tape 102 of the component storage tape 100, which travels along the guide surfaces 5, is separated by the cover tape pre-processing portion 602, is lifted by the cover tape lifting portion 601, and is pushed outward by the cover tape post-processing portion 603. This exposes the component E2 in the component storage portion 101a of the component storage tape 100 so that the component E2 can be taken out.

Figure 25:
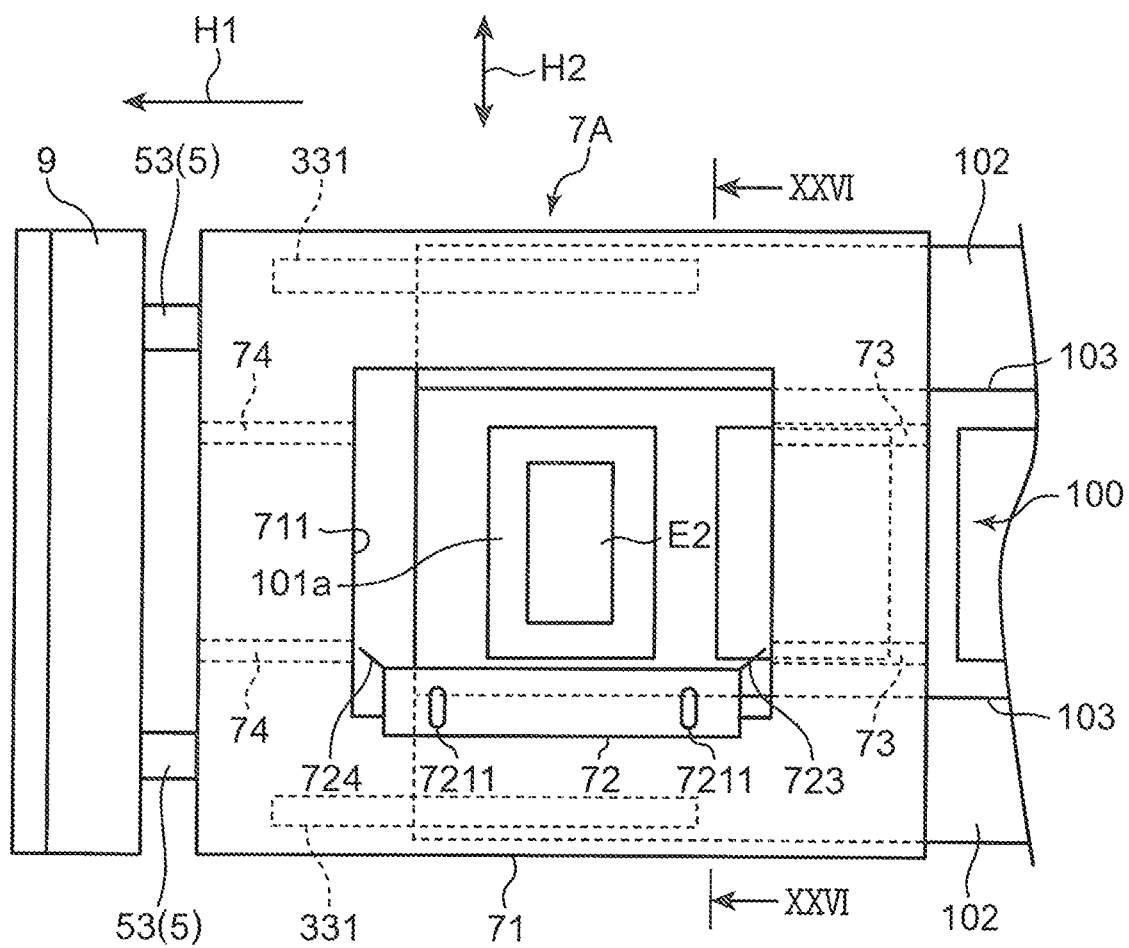
FIG. 25 is a plan view of the tape traveling guide unit disposed on the downstream side of the component exposing unit of the cover tape separating type.
Figure 26:
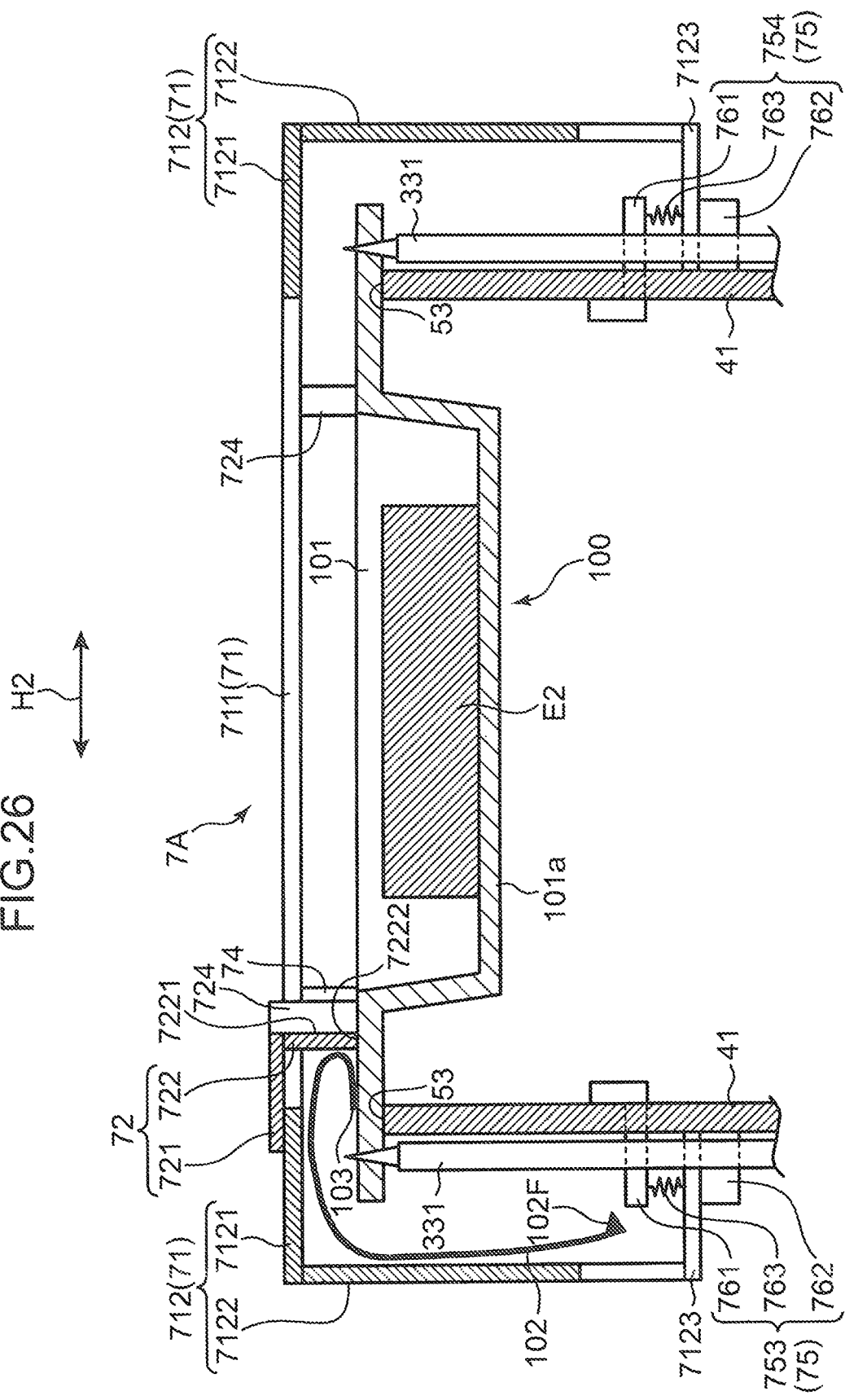
FIG. 26 is a sectional view of the tape traveling guide unit of FIG. 25, the sectional view being taken along a XXVI-XXVI section line.

On the downstream side of the component exposing unit 60 of the cover tape separating type, a tape traveling guide unit 7A shown in FIGS. 25 and 26 is disposed. FIG. 25 is a plan view of the tape traveling guide unit 7A. FIG. 26 is a sectional view of the tape traveling guide unit 7A of FIG. 25, the sectional view being taken along a XXVI-XXVI section line.

On the tape traveling guide unit 7 disposed on the downstream side of the above component exposing unit 6 of the cover tape cutting type, the opening width defining members 72 are disposed respectively on both sides in the tape width direction H2, relative to the opening 711 of the guide body 71. On the tape traveling guide unit 7A disposed on the downstream side of the component exposing unit 60 of the cover tape separating type, in contrast, the opening width defining member 72 is disposed only on the other side in the tape width direction H2, relative to the opening 711 of the guide body 71. Except this respect, the tape traveling guide unit 7 and the tape traveling guide unit 7A are the same in configuration.

Second Modified Embodiment

Figure 27:
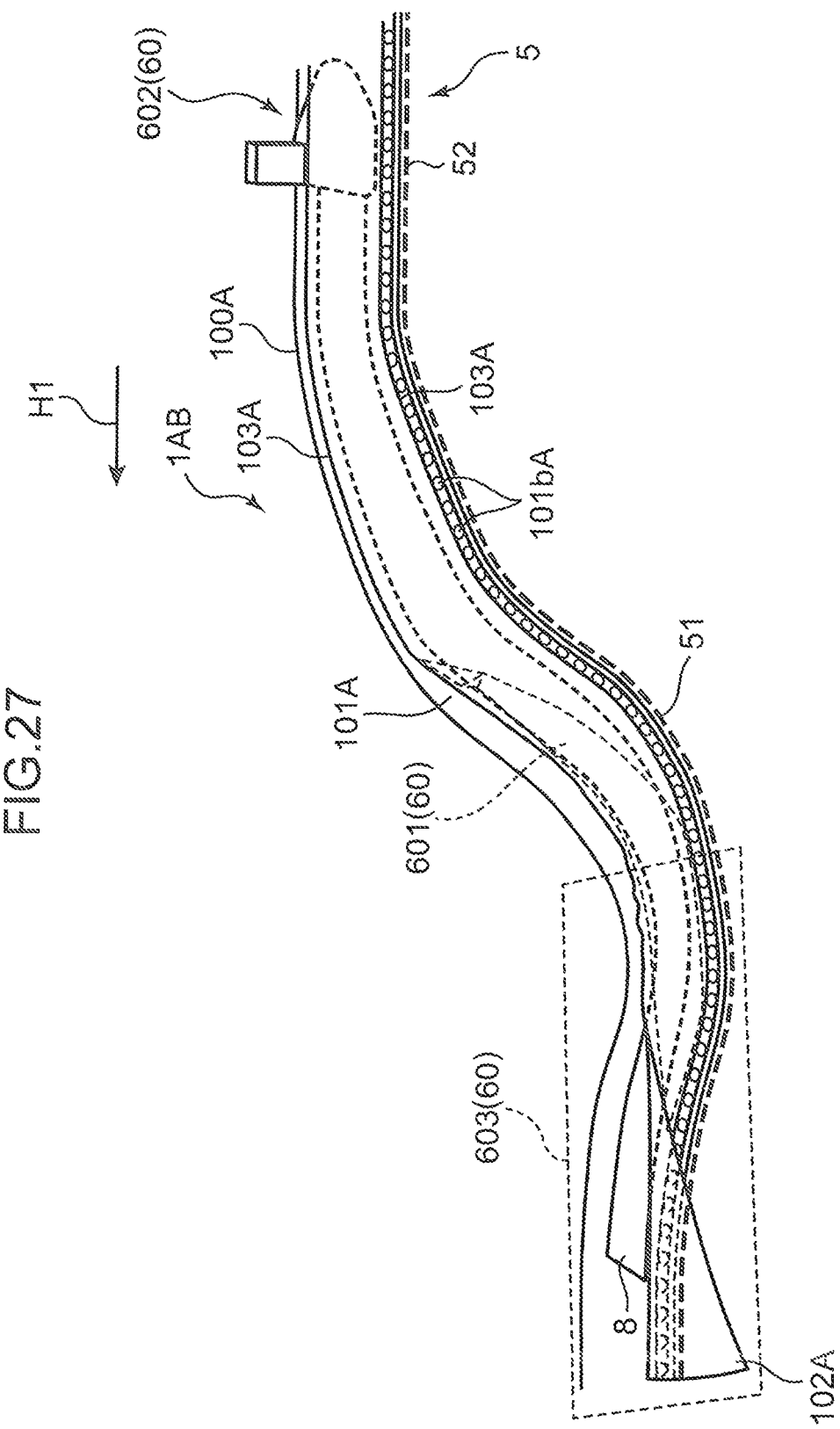
FIG. 27 is a perspective view of a component exposing unit used for a component storage tape with a small width.

In the embodiment described above, the component feeding device that feeds components using the component storage tape 100 with a large width of 32 mm or more has been described. According to the present disclosure, the configuration of the component feeding device is not limited to this. The component feeding device, for example, may be configured such that it feeds components using a component storage tape with a small width of less than 32 mm (e.g., 12 mm, 16 mm, or 24 mm). FIG. 27 is a perspective view of a component exposing unit included in a component feeding device 1AB that uses a component storage tape 100A with a small width.

The component storage tape 100A with a small width includes a carrier tape 101A and a cover tape 102A. The carrier tape 101A, which is similar to the carrier tape 101 of the component storage tape 100 with a large width, is a tape having a plurality of component storage portions in which components are stored, the component storage portions being arranged at given intervals. The carrier tape 101A has holes 101bA that are formed only on one end on one side in the width direction of the carrier tape 101A at given intervals. The cover tape 102A is a tape pasted on the carrier tape 101A in such a way as to cover the component storage portions. The cover tape 102A is pasted on the carrier tape 101A by joining both ends in the width direction of the cover tape 102A to the carrier tape 101A. As a result, on the component storage tape 100A, joined portions 103A, which result from the cover tape 102A being joined to the carrier tape 101A, are formed respectively on both ends in the width direction of an upper surface of the carrier tape 101A such that the joined portions 103A extend linearly along edges in the width direction of the cover tape 102A.

In the tape send-off unit 3 that is included in the above component feeding device 1 using the component storage tape 100 with a large width, the first tape send-off portion 31, the second tape send-off portion 32, and the third tape send-off portion 33 each include a pair of sprockets. In a tape send-off unit that is included in the component feeding device 1AB using the component storage tape 100A with a small width, in contrast, a first tape send-off portion, a second tape send-off portion, and a third tape send-off portion each include a sprocket that is disposed on the side on which the sprocket corresponds to the holes 101bA formed on the component storage tape 100A. Each sprocket of the first tape send-off portion, the second tape send-off portion, and the third tape send-off portion, which are included in the component feeding device 1AB, rotates as the teeth of the sprocket are fitted in the holes 101bA of the component storage tape 100A, thereby sending off the component storage tape 100A.

As shown in FIG. 27, the component feeding device 1AB using the component storage tape 100A with a small width includes the component exposing unit 60 of the cover tape separating type, which has been described above as the first modified embodiment. On the component exposing unit 60 of the component feeding device 1AB, the cover tape pre-processing portion 602 separates the cover tape 102A of the component storage tape 100A along the joined portion 103A opposite to the side on which the holes 101bA are formed. The cover tape lifting portion 601 lifts the separated cover tape 102A. Then, the cover tape post-processing portion 603 pushes the lifted part of the cover tape 102A to outside of the side edge opposite to the side on which the cover tape 102A is separated by the cover tape pre-processing portion 602 and folds the lifted part of the cover tape 102A downward. This exposes the component in the component storage portion of the component storage tape 100A so that the component can be taken out.

The width of the cover tape 102A of the component storage tape 100A with a small width is smaller than the width of the cover tape 102 of the component storage tape 100 with a large width. When the component exposing process is carried out on the component storage tape 100A with a tape width of 12 mm or 16 mm, using the component exposing unit 6 of the cover tape cutting type included in the component feeding device 1, it is difficult to push the lifted part of the cover tape 102A outward to an extent that the lifted part is located outside the carrier tape 101A. It is preferable, for this reason, that the component exposing unit 60 of the cover tape separating type be adopted as the component exposing unit that carries out the component exposing process on the component storage tape 100A with a small tape width of 12 mm or 16 mm. As the component exposing unit that carries out the component exposing process on the component storage tape 100A with a tape width of 24 mm, either the component exposing unit 6 of the cover tape cutting type or the component exposing unit 60 of the cover tape separating type may be used.

In the component feeding device 1AB, the tape traveling guide unit 7A (see FIGS. 25 and 26), which has been described above as the first modified embodiment, can be adopted, as the tape traveling guide unit disposed on the downstream side of the component exposing unit 60.

The above specific embodiments include aspects of the disclosure that offer various configurations in the following manner.

A component feeding device according to an aspect of the present disclosure is a component feeding device that sends off a component storage tape having a cover tape on an upper surface side of the component storage tape, the component storage tape including a carrier tape having a plurality of component storage portions storing components therein, the component storage portions being arranged at given intervals, and the cover tape having both ends in a width direction joined to the carrier tape such that the cover tape covers the component storage portions, to feed the components. The component feeding device includes: a pair of guide walls having guide surfaces that guide both lower surface ends of the component storage tape, respectively, the lower surface ends being both ends of a lower surface of the component storage tape in a tape width direction perpendicular to a tape send-off direction; a component exposing unit that carries out a component exposing process of lifting the cover tape of the component storage tape that travels as the lower surface ends of the component storage tape are guided by the guide surfaces, along a joined portion serving as a starting point, the joined portion being a portion where the cover tape is joined to the carrier tape, and pushing a lifted part of the cover tape to outside of a side edge in the tape width direction of the component storage tape while folding the lifted part downward to expose the component; and a tape traveling guide unit disposed on a downstream side in the tape send-off direction of the component exposing unit, the tape traveling guide unit guiding the component storage tape having been subjected to the component exposing process by the component exposing unit to help the component storage tape in traveling. The tape traveling guide unit includes: a guide body having an opening facing the component storage portion, the opening having a given length in the tape send-off direction, and a cover tape path demarcating portion disposed outside the opening in the tape width direction, the cover tape path demarcating portion demarcating a cover tape path through which a lifted part of the cover tape passes; and an opening width defining member fitted to the guide body, the opening width defining member defining an opening width in the tape width direction of the opening and coming in contact with a first specific area of an upper surface of the carrier tape, the first specific area being between the component storage portion and the joined portion in the tape width direction, to apply a downward pressure to the first specific area.

According to the component feeding device, the lifted part of the cover tape of the component storage tape, which travels along the guide surfaces of the pair of guide walls, is pushed outward relative to the carrier tape and is folded downward, by the component exposing unit. As a result, the component storage portion of the component storage tape is made open to the outside. The tape traveling guide unit guides the component storage tape having been subjected to the component exposing process by the component exposing unit to help the component storage tape in traveling. The tape traveling guide unit includes the guide body and the opening width defining member fitted to the guide body. The guide body includes the opening serving as an opening for taking out the component stored in the component storage portion, and the cover tape path demarcating portion that demarcates a path through the lifted part of the cover tape passes. The opening width defining member defines the opening width of the opening, and applies a downward pressure to the first specific area of the upper surface of the carrier tape.

On the component storage tape having been subjected to the component exposing process by the component exposing unit, the lifted part of the cover tape is in a state of being pushed outward relative to the carrier tape and being folded downward. Because the cover tape is in this state, when the component storage tape passes the tape traveling guide unit, a force that causes the cover tape to rise acts on the tape traveling guide unit. When the cover tape path demarcating portion of the guide body applies an excessive force to the cover tape to prevent it from rising, it may impair the steadiness of traveling of the component storage tape and may also create a resistive force against traveling, which raises a possibility that the traveling performance of the component storage tape may deteriorate.

To avoid such a case, on the tape traveling guide unit, the opening width defining member, which defines the opening width of the opening serving as the opening for taking out the component, applies a downward pressure to the first specific area of the upper surface of the carrier tape. This ensures that the component storage tape travels steadily. Meanwhile, on the tape traveling guide unit, the cover tape path demarcating portion of the guide body does not put constraint on the cover tape but rather allows the cover tape to rise to some extent, thus demarcating a path that embraces the cover tape. This reduces the traveling resistance that arises when the component storage tape travels, thus improving the traveling performance of the component storage tape. As a result, the component feeding device can efficiently transfer the component to the opening serving as the opening for taking out the component stored in the component storage tape.

In the above component feeding device, the cover tape path demarcating portion of the guide body includes an upper counter portion facing the cover tape from a location above the guide surfaces of the pair of guide walls, and a side counter portion facing to the cover tape from a location outside the pair of guide walls in the tape width direction. The opening width defining member includes a base fitted to the upper counter portion, and an extended piece extended downward from the base and inserted in the opening, the extended piece having a surface serving as a defining surface that defines the opening width of the opening, and a lower end face serving as a pressure-applying surface that applies a pressure to the first specific area of the upper surface of the carrier tape.

In this aspect, the upper counter portion facing the cover tape from the location above the guide surfaces and the side counter portion facing the cover tape from the location outside the pair of guide walls can make up the cover tape path demarcating portion. The base fitted to the upper counter portion and the extended piece extended downward from the base and inserted in the opening can make up the opening width defining member.

In the above component feeding device, the base of the opening width defining member includes a fitting portion via which the base is fitted to the upper counter portion, the fitting portion allowing a change in a position in the tape width direction of the defining surface of the extended piece.

On the component storage tape, the length of the component storage portion in the tape width direction is determined in accordance with the size of the component stored in the component storage portion. In other words, on the component storage tape, the length of the component storage portion in the tape width direction varies depending on the size of the component even when the length of the tape in the tape width direction remains the same. For this reason, it is necessary for the opening width defining member to define the opening width of the opening in accordance with the length of the component storage portion in the tape width direction. To meet this requirement, the base of the opening width defining member is fitted to the upper counter portion via the fitting portion in such a way as to allow a change in the position in the tape width direction of the defining surface of the extended piece extended downward from the base. Thus, the opening width defining member can define the opening width of the opening in accordance with the length of the component storage portion in the tape width direction, using the defining surface of the extended piece.

In the above component feeding device, the tape traveling guide unit further includes a tape guide-in portion fitted to a part of the guide body that is on an upstream side in the tape send-off direction of the opening, the tape guide-in portion extending in the tape send-off direction and guiding the cover tape into the cover tape path while coming in contact with a second specific area of the upper surface of the carrier tape, the second specific area being located inward in the tape width direction relative to the first specific area, and a tape guide-out portion fitted to a part of the guide body that is on a downstream side in the tape send-off direction of the opening, the tape guide-out portion extending in the tape send-off direction and guiding the cover tape out of the cover tape path while coming in contact with the second specific area of the upper surface of the carrier tape. The opening width defining member further includes a first projection extending slantly from an upstream end in the tape send-off direction of the extended piece toward a downstream end in the tape send-off direction of the tape guide-in portion, and a second projection extending slantly from a downstream end in the tape send-off direction of the extended piece toward an upstream end in the tape send-off direction of the tape guide-out portion.

In this aspect, on the component storage tape having passed the tape guide-in portion, the lifted part of the cover tape comes in contact with the first projection of the opening width defining member and is guided into the cover tape path demarcated by the cover tape path demarcating portion. In this manner, the lifted part of the cover tape of the component storage tape having passed the tape guide-in portion can smoothly be guided into the cover tape path demarcating portion. Then, the lifted part of the cover tape having passed through the cover tape path demarcating portion comes in contact with the second projection of the opening width defining member and is guided to the tape guide-out portion. In this manner, the lifted part of the cover tape having passed through the cover tape path demarcating portion can smoothly be guided out of the cover tape path demarcating portion.

In the above component feeding device, the tape guide-in portion includes a tape guide-in tapered portion of a tapered shape, the tape guide-in tapered portion being formed on an upstream end in the tape send-off direction. The tape guide-in tapered portion has a first sloped surface sloping upward toward a front edge, the first sloped surface being a lower surface of the tape guide-in tapered portion, and a second sloped surface sloping inward in the tape width direction toward the front edge, the second sloped surface being a side surface of the tape guide-in tapered portion that is located on an outer side in the tape width direction.

On the component storage tape having passed the component exposing unit, the lifted part of the cover tape is guided into the cover tape path demarcated by the cover tape path demarcating portion, via the tape guide-in portion. The tape guide-in portion is configured to include the tape guide-in tapered portion formed on its upstream end in the tape send-off direction. In this configuration, the cover tape of the component storage tape having passed the component exposing unit is guided smoothly to the tape guide-in portion.

In the above component feeding device, the tape guide-out portion includes a tape guide-out tapered portion of a tapered shape, the tape guide-out tapered portion being formed on an upstream end in the tape send-off direction. The tape guide-out tapered portion has a third sloped surface sloping upward toward a front edge, the third sloped surface being a lower surface of the tape guide-out tapered portion, and a fourth sloped surface sloping inward in the tape width direction toward the front edge, the fourth sloped surface being a side surface of the tape guide-out tapered portion that is located on an outer side in the tape width direction.

The lifted part of the cover tape having passed through the cover tape path demarcating portion is guided out along the tape guide-out portion. The tape guide-out portion is configured to include the tape guide-out tapered portion formed on its upstream end in the tape send-off direction. In this configuration, the lifted part of the cover tape having passed through the cover tape path demarcating portion is guided smoothly to the tape guide-out portion.

In the above component feeding device, the tape traveling guide unit further includes a coupling mechanism that couples the guide body to the pair of guide walls such that the guide body is allowed to shift in position in a vertical direction.

In the above component feeding device, the coupling mechanism includes a first coupling portion and a second coupling portion that couple both ends in the tape width direction of the guide body, the ends being on an upstream end side in the tape send-off direction, to the pair of guide walls, respectively, and a third coupling portion and a fourth coupling portion that couple both ends in the tape width direction of the guide body, the ends being on a downstream end side in the tape send-off direction, to the pair of guide walls, respectively.

In the component feeding device, each of the first to fourth coupling portions includes an upper limit stopper fitted to each of the pair of guide walls, the upper limit stopper determining an upper limit position of the guide body that shifts in position in a vertical direction, a lower limit stopper fitted to each of the pair of guide walls in such a way as to be under the upper limit stopper, the lower limit stopper determining a lower limit position of the guide body that shifts in position in the vertical direction, and a biasing member disposed between the upper limit stopper and the lower limit stopper, the biasing member applying a downward pressure to the guide body to allow the guide body to shift in position in the vertical direction.

On the tape traveling guide unit, the guide body is coupled to the pair of guide walls via the coupling mechanism such that the guide body is allowed to shift in position in the vertical direction. In this configuration, it is ensured that the component storage tape travels steadily when passing the tape traveling guide unit.

The component feeding device further includes a tape ejection guide unit disposed on a downstream side in the tape send-off direction of the tape traveling guide unit on the pair of guide walls, the tape ejection guide unit guiding the component storage tape having passed the tape traveling guide unit to facilitate ejection of the component storage tape on the downstream side. The tape ejection guide unit includes an upper surface regulating portion that comes in contact with an upper surface of the component storage tape to regulate an upward movement of the component storage tape.

The component storage tape having passed the tape traveling guide unit droops down when ejected out of the component feeding device. At this time, the component storage tape is folded at an area between adjacent component storage portions of the carrier tape and droops down as a consequence. In this manner, the component storage tape folded at the area between adjacent component storage portions shows a tendency to bulge upward. It is difficult to suppress an upward bulging motion of the component storage tape by the downward pressure that the opening width defining member of the tape traveling guide unit applies to the carrier tape. It is thus possible that the upward bulging of the component storage tape ejected out of the component feeding device may lift the guide body up.

To prevent such a case, the component feeding device is provided with the tape ejection guide unit. On the tape ejection guide unit, the upper surface regulating portion comes in contact with the upper surface of the component storage tape having passed the tape traveling guide unit, thereby regulating the upward movement of the component storage tape. In this manner, the upward bulging of the component storage tape ejected out of the component feeding device can be suppressed.

A component mounter according to another aspect of the present disclosure includes: the above component feeding device; and a head unit that takes out a component through the opening, the component being fed by the component feeding device.

This component mounter includes the component feeding device that can transfer a component stored in the component storage tape efficiently to the component take-out position. A drop in the efficiency of production of component-carrying boards by the component mounter is, therefore, prevented.

As described above, according to the present disclosure, a component feeding device that can efficiently feed components stored in a component storage tape and a component mounter having the component feeding device can be provided.

What is claimed is:

1. A component feeding device that sends off a component storage tape having a cover tape on an upper surface side of the component storage tape, the component storage tape including a carrier tape having a plurality of component storage portions storing components therein, the component storage portions being arranged at given intervals, and the cover tape having both ends in a width direction joined to the carrier tape such that the cover tape covers the component storage portions, to feed the components, the component feeding device comprising:
   a pair of guide walls having guide surfaces configured to guide both lower surface ends of the component storage tape, respectively, the lower surface ends being both ends of a lower surface of the component storage tape in a tape width direction perpendicular to a tape send-off direction;
   a component exposing unit configured to perform a component exposing process of lifting the cover tape of the component storage tape that travels as the lower surface ends of the component storage tape are guided by the guide surfaces, along a joined portion serving as a starting point, the joined portion being a portion where the cover tape is joined to the carrier tape, and pushing a lifted part of the cover tape to outside of a side edge in the tape width direction of the component storage tape while folding the lifted part downward to expose the component; and
   a tape traveling guide unit disposed on a downstream side in the tape send-off direction of the component exposing unit, the tape traveling guide unit configured to guide the component storage tape having been subjected to the component exposing process by the component exposing unit to help the component storage tape in traveling,
   wherein the tape traveling guide unit includes:
   a guide body having an opening facing the component storage portion, the opening having a given length in the tape send-off direction, and a cover tape path demarcating portion disposed outside the opening in the tape width direction, the cover tape path demarcating portion demarcating a cover tape path through which a lifted part of the cover tape passes; and
   an opening width defining member fitted to the guide body, the opening width defining member defining an opening width in the tape width direction of the opening and configured to contact a first specific area of an upper surface of the carrier tape, the first specific area being between the component storage portion and the joined portion in the tape width direction, to apply a downward pressure to the first specific area.

2. The component feeding device according to claim 1,
wherein the cover tape path demarcating portion of the guide body includes:
an upper counter portion facing the cover tape from a location above the guide surfaces of the pair of guide walls; and
a side counter portion facing the cover tape from a location outside the pair of guide walls in the tape width direction, and
wherein the opening width defining member includes:
a base fitted to the upper counter portion, and
an extended piece extended downward from the base and inserted in the opening, the extended piece having a surface serving as a defining surface that defines the opening width of the opening, and a lower end face serving as a pressure-applying surface that is configured to apply a pressure to the first specific area of the upper surface of the carrier tape.

3. The component feeding device according to claim 2, wherein the base of the opening width defining member includes a fitting portion via which the base is fitted to the upper counter portion, the fitting portion allowing a change in a position in the tape width direction of the defining surface of the extended piece.

4. The component feeding device according to claim 3, wherein the tape traveling guide unit further includes:
a tape guide-in portion fitted to a part of the guide body that is on an upstream side in the tape send-off direction of the opening, the tape guide-in portion extending in the tape send-off direction and configured to guide the cover tape into the cover tape path while coming in contact with a second specific area of the upper surface of the carrier tape, the second specific area being located inward in the tape width direction relative to the first specific area; and
a tape guide-out portion fitted to a part of the guide body that is on a downstream side in the tape send-off direction of the opening, the tape guide-out portion extending in the tape send-off direction and configured to guide the cover tape out of the cover tape path while coming in contact with the second specific area of the upper surface of the carrier tape, and
wherein the opening width defining member further includes:
a first projection extending slantly from an upstream end in the tape send-off direction of the extended piece toward a downstream end in the tape send-off direction of the tape guide-in portion; and
a second projection extending slantly from a downstream end in the tape send-off direction of the extended piece toward an upstream end in the tape send-off direction of the tape guide-out portion.

5. The component feeding device according to claim 4, wherein the tape guide-in portion includes a tape guide-in tapered portion of a tapered shape, the tape guide-in tapered portion being formed on an upstream end in the tape send-off direction, and
wherein the tape guide-in tapered portion has a first sloped surface sloping upward toward a front edge, the first sloped surface being a lower surface of the tape guide-in tapered portion, and a second sloped surface sloping inward in the tape width direction toward the front edge, the second sloped surface being a side surface of the tape guide-in tapered portion that is located on an outer side in the tape width direction.

6. The component feeding device according to claim 4,
wherein the tape guide-out portion includes a tape guide-out tapered portion of a tapered shape, the tape guide-out tapered portion being formed on an upstream end in the tape send-off direction, and
wherein the tape guide-out tapered portion has a third sloped surface sloping upward toward a front edge, the third sloped surface being a lower surface of the tape guide-out tapered portion, and a fourth sloped surface sloping inward in the tape width direction toward the front edge, the fourth sloped surface being a side surface of the tape guide-out tapered portion that is located on an outer side in the tape width direction.

7. The component feeding device according to claim 1, wherein the tape traveling guide unit further includes a coupling mechanism that couples the guide body to the pair of guide walls such that the guide body is allowed to shift in position in a vertical direction.

8. The component feeding device according to claim 7, wherein the coupling mechanism includes:
a first coupling portion and a second coupling portion that couple both ends in the tape width direction of the guide body, the ends being on an upstream end side in the tape send-off direction, to the pair of guide walls, respectively; and
a third coupling portion and a fourth coupling portion that couple both ends in the tape width direction of the guide body, the ends being on a downstream end side in the tape send-off direction, to the pair of guide walls, respectively.

9. The component feeding device according to claim 8, wherein each of the first to fourth coupling portions includes:
an upper limit stopper fitted to each of the pair of guide walls, the upper limit stopper determining an upper limit position of the guide body that shifts in position in a vertical direction;
a lower limit stopper fitted to each of the pair of guide walls in such a way as to be under the upper limit stopper, the lower limit stopper determining a lower limit position of the guide body that shifts in position in the vertical direction; and
a biasing member disposed between the upper limit stopper and the lower limit stopper, the biasing member applying a downward pressure to the guide body to allow the guide body to shift in position in the vertical direction.

10. The component feeding device according to claim 1, further comprising
a tape ejection guide unit disposed on a downstream side in the tape send-off direction of the tape traveling guide unit on the pair of guide walls, the tape ejection guide unit being configured to guide the component storage tape having passed the tape traveling guide unit to facilitate ejection of the component storage tape on the downstream side,
wherein the tape ejection guide unit includes an upper surface regulating portion configured to contact an upper surface of the component storage tape to regulate an upward movement of the component storage tape.

11. A component mounter comprising:
the component feeding device according to claim 1; and
a head unit configured to take out a component through the opening, the component being fed by the component feeding device.

12. A component mounter comprising:
the component feeding device according to claim 2; and
a head unit configured to take out a component through the opening, the component being fed by the component feeding device.

13. A component mounter comprising:
the component feeding device according to claim 3; and
a head unit configured to take out a component through the opening, the component being fed by the component feeding device.

14. A component mounter comprising:
the component feeding device according to claim 4; and
a head unit configured to take out a component through the opening, the component being fed by the component feeding device.

15. A component mounter comprising:
the component feeding device according to claim 5; and
a head unit configured to take out a component through the opening, the component being fed by the component feeding device.

16. A component mounter comprising:
the component feeding device according to claim 6; and
a head unit configured to take out a component through the opening, the component being fed by the component feeding device.

17. A component mounter comprising:
the component feeding device according to claim 7; and
a head unit configured to take out a component through the opening, the component being fed by the component feeding device.

18. A component mounter comprising:
the component feeding device according to claim 8; and
a head unit configured to take out a component through the opening, the component being fed by the component feeding device.

19. A component mounter comprising:
the component feeding device according to claim 9; and
a head unit configured to take out a component through the opening, the component being fed by the component feeding device.

20. A component mounter comprising:
the component feeding device according to claim 10; and
a head unit configured to take out a component through the opening, the component being fed by the component feeding device.

* * * * *